(12) United States Patent
Yang et al.

(10) Patent No.: US 12,336,183 B2
(45) Date of Patent: *Jun. 17, 2025

(54) THREE-DIMENSIONAL FERROELECTRIC RANDOM ACCESS MEMORY DEVICES AND METHODS OF FORMING

(71) Applicant: Taiwan Semiconductor Manufacturing Co., Ltd., Hsinchu (TW)

(72) Inventors: Tsuching Yang, Hsinchu (TW); Hung-Chang Sun, Kaohsiung (TW); Kuo Chang Chiang, Hsinchu (TW); Sheng-Chih Lai, Hsinchu (TW); Yu-Wei Jiang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/413,668

(22) Filed: Jan. 16, 2024

(65) Prior Publication Data

US 2024/0155845 A1 May 9, 2024

Related U.S. Application Data

(63) Continuation of application No. 17/316,167, filed on May 10, 2021, now Pat. No. 11,903,214.

(Continued)

(51) Int. Cl.
*H10B 51/10* (2023.01)
*G11C 11/22* (2006.01)
(Continued)

(52) U.S. Cl.
CPC .......... *H10B 51/20* (2023.02); *G11C 11/2255* (2013.01); *G11C 11/2257* (2013.01); *H10B 51/10* (2023.02); *H10B 51/30* (2023.02)

(58) Field of Classification Search
CPC ........ H10B 51/20; H10B 51/10; H10B 51/30; G11C 11/2255; G11C 11/2257
See application file for complete search history.

(56) References Cited

U.S. PATENT DOCUMENTS 10,079,247 B2  9/2018  Kim
10,424,598 B2  9/2019  Liu et al.
(Continued)

FOREIGN PATENT DOCUMENTS

CN        109698162 A      4/2019
DE    102020130890 A1     12/2021
(Continued)

*Primary Examiner* — David Vu
*Assistant Examiner* — Brandon C Fox
(74) *Attorney, Agent, or Firm* — Slater Matsil, LLP

(57) ABSTRACT

A method of forming a ferroelectric random access memory (FeRAM) device includes: forming a layer stack over a substrate, where the layer stack includes alternating layers of a first dielectric material and a word line (WL) material; forming first trenches extending vertically through the layer stack; filling the first trenches, where filling the first trenches includes forming, in the first trenches, a ferroelectric material, a channel material over the ferroelectric material, and a second dielectric material over the channel material; after filling the first trenches, forming second trenches extending vertically through the layer stack, the second trenches being interleaved with the first trenches; and filling the second trenches, where filling the second trenches includes forming, in the second trenches, the ferroelectric material, the channel material over the ferroelectric material, and the second dielectric material over the channel material.

20 Claims, 19 Drawing Sheets

Related U.S. Application Data

(60) Provisional application No. 63/052,499, filed on Jul. 16, 2020.

(51) Int. Cl.
   *H10B 51/20* (2023.01)
   *H10B 51/30* (2023.01)

(56) References Cited

U.S. PATENT DOCUMENTS

| | | | |
|---|---|---|---|
| 10,777,566 | B2 | 9/2020 | Lue |
| 10,811,427 | B1 * | 10/2020 | Jiang ................ H10B 43/23 |
| 11,903,214 | B2 * | 2/2024 | Yang ................ G11C 11/2255 |
| 2015/0243674 | A1 | 8/2015 | Shih et al. |
| 2016/0118404 | A1 | 4/2016 | Peng |
| 2020/0185411 | A1 | 6/2020 | Herner et al. |
| 2021/0375927 | A1 | 12/2021 | Chia et al. |
| 2022/0037253 | A1 | 2/2022 | Yang et al. |
| 2022/0359270 | A1 | 11/2022 | Chia et al. |

FOREIGN PATENT DOCUMENTS

| | | | |
|---|---|---|---|
| KR | 20180051991 A | | 5/2018 |
| TW | 201824518 A | | 7/2018 |
| TW | 201931577 A | | 8/2019 |
| TW | 202025461 A | | 7/2020 |
| WO | 2019152226 A1 | | 8/2019 |

* cited by examiner

THREE-DIMENSIONAL FERROELECTRIC RANDOM ACCESS MEMORY DEVICES AND METHODS OF FORMING

PRIORITY CLAIM AND CROSS-REFERENCE

This application is a continuation of U.S. patent application Ser. No. 17/316,167, filed May 10, 2021, entitled "Three-Dimensional Ferroelectric Random Access Memory Devices and Methods of Forming," which claims the benefit of U.S. Provisional Application No. 63/052,499, filed on Jul. 16, 2020, which applications are hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information stored when they are not powered.

On the other hand, non-volatile memories can keep data stored on them without power being supplied. One type of non-volatile semiconductor memory is ferroelectric random access memory (FeRAM, or FRAM). Advantages of FeRAM include its fast write/read speed and small size.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
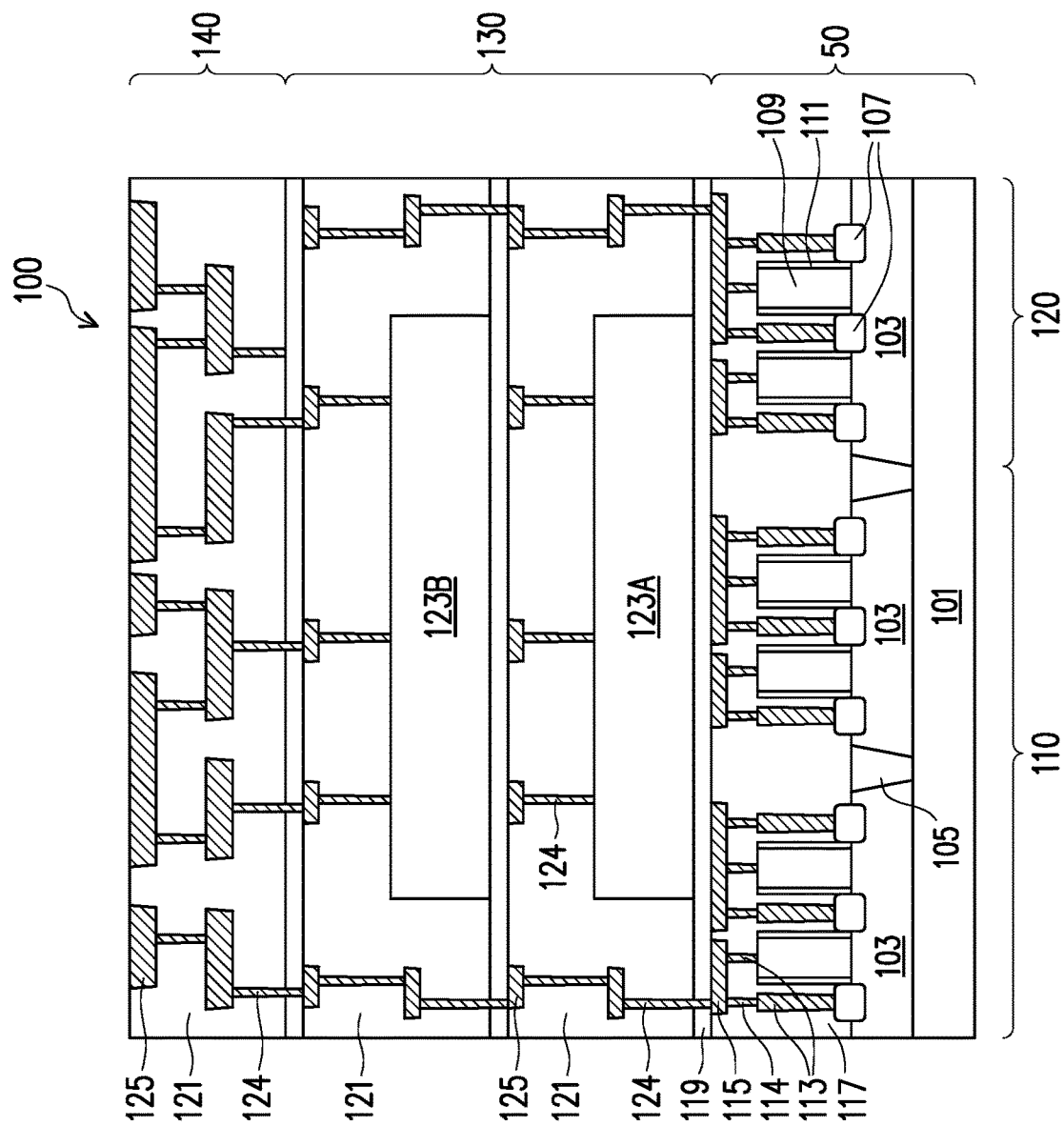
FIG. 1 illustrates a cross-sectional view of a semiconductor device with integrated memory devices, in an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar reference numeral in different figures refers to the same or similar element formed by a same or similar process using a same or similar material(s).

In some embodiments, a Litho-Etch-Dep-Litho-Etch-Dep (LEDLED) method is disclosed for forming high-density memory arrays in a ferroelectric random access memory (FeRAM) device. The LEDLED method includes forming a first plurality of trenches in a layer stack over a substrate, where the layer stack includes alternating layers of a first dielectric material and a word line (WL) material. The first plurality of trenches are then filled by forming a ferroelectric material, a channel material, and a second dielectric material successively in the first plurality of trenches. After filling the first plurality of trenches, a second plurality of trenches are formed in the layer stack, where the second plurality of trenches are interleaved with the first plurality of trenches. The second plurality of trenches are then filled with the ferroelectric material, the channel material, and the second dielectric material. Next, source lines (SLs) and bit lines (BLs) are formed in the first and second plurality of trenches. Compared with a reference method where the first and second plurality of trenches are formed simultaneously, the LEDLED method allows the first and second plurality of trenches to be formed closer to each other for higher integration density while avoiding the fin structure collapsing issue encountered by the reference method.

FIG. 1 illustrates a cross-sectional view of a semiconductor device 100 with integrated memory devices 123 (e.g., 123A and 123B), in an embodiment. The semiconductor device 100 is a fin-field effect transistor (FinFET) device with three-dimensional (3D) ferroelectric random access memory (FeRAM) devices 123 integrated in the back-end-of-line (BEOL) processing of semiconductor manufacturing, in the illustrated embodiment. To avoid clutter, details of the memory devices 123 are not shown in FIG. 1, but are illustrated in subsequent figures hereinafter. Note that FinFET is used as a non-limiting example here, the FeRAM devices 123 may be integrated in the BEOL processing with any suitable device, such as planar devices or gate-all-around (GAA) devices.

As illustrated in FIG. 1, the semiconductor device 100 includes different regions for forming different types of circuits. For example, the semiconductor device 100 may include a first region 11o for forming logic circuits, and may include a second region 120 for forming, e.g., peripheral circuits, input/output (I/O) circuits, electrostatic discharge (ESD) circuits, and/or analog circuits. Other regions for forming other types of circuits are possible and are fully intended to be included within the scope of the present disclosure.

The semiconductor device 100 includes a substrate 101. The substrate 101 may be a bulk substrate, such as a silicon substrate, doped or undoped, or an active layer of a semiconductor-on-insulator (SOI) substrate. The substrate 101 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Electrical components, such as transistors, resistors, capacitors, inductors, diodes, or the like, are formed in or on the substrate 101 in the front-end-of-line (FEOL) processing of semiconductor manufacturing. In the example of FIG. 1, semiconductor fins 103 (also referred to as fins) are formed protruding above the substrate 101. Isolation regions 105, such as shallow-trench isolation (STI) regions, are formed between or around the semiconductor fins 103. Gate electrodes 109 are formed over the semiconductor fins 103. Gate spacers 11 are formed along sidewalls of the gate electrodes 109. Source/drain regions 107, such as epitaxial source/drain regions, are formed on opposing sides of the gate electrodes 109. Contacts 113, such as gate contacts and source/drain contacts, are formed over and electrically coupled to respective underlying electrically conductive features (e.g., gate electrodes 109 or source/drain regions 107). One or more dielectric layers 117, such as an inter-layer dielectric (ILD) layer, is formed over the substrate 101 and around the semiconductor fins 103 and the gate electrodes 109. Other electrically conductive features, such as interconnect structures comprising conductive lines 115 and vias 114, may also be formed in the one or more dielectric layers 117. The FinFETs in FIG. 1 may be formed by any suitable method known or used in the art, details are not repeated here. For ease of discussion herein, the substrate 101, the electrical components (e.g., FinFETs) formed in or on the substrate 101, the contacts 113, conductive features 115/114, and the one or more dielectric layers 117 are collectively referred to as substrate 50.

Still referring to FIG. 1, a dielectric layer 119, which may be an etch stop layer (ESL), is formed over the one or more dielectric layers 117. In an embodiment, the dielectric layer 119 is formed of silicon nitride using plasma-enhanced physical vapor deposition (PECVD), although other dielectric materials such as nitride, carbide, combinations thereof, or the like, and alternative techniques of forming the dielectric layer 119, such as low-pressure chemical vapor deposition (LPCVD), PVD, or the like, could alternatively be used. In some embodiments, the dielectric layer 119 is omitted. Next, a dielectric layer 121 is formed over the dielectric layer 119. The dielectric layer 121 may be any suitable dielectric material, such as silicon oxide, silicon nitride, or the like, formed by a suitable method, such as PVD, CVD, or the like. One or more memory device 123A, each of which includes a plurality of memory cells, are formed in the dielectric layer 121 and coupled to electrically conductive features (e.g., vias 124 and conductive lines 125) in the dielectric layer 121. Various embodiments of the memory devices 123A or 123B in FIG. 1 (e.g., 3D FeRAM devices 200, 200A, and 200B) are discussed hereinafter in details.

FIG. 1 further illustrates a second layer of memory devices 123B formed over the memory devices 123A. The memory devices 123A and 123B may have a same or similar structure, and may be collectively referred to as memory devices 123. The example of FIG. 1 illustrates two layers of memory devices 123 as a non-limiting example. Other numbers of layers of memory devices 123, such as one layer, three layers, or more, are also possible and are fully intended to be included within the scope of the present disclosure. The one or more layers of memory device 123 are formed in a memory region 130 of the semiconductor device 100, and may be formed in the back-end-of-line (BEOL) processing of semiconductor manufacturing. The memory devices 123 may be formed in the BEOL processing at any suitable locations within the semiconductor device 100, such as over (e.g., directly over) the first region 11o, over the second region 120, or over a plurality of regions.

In the example of FIG. 1, the memory devices 123 occupy some, but not all, of the areas of the memory region 130 of the semiconductor device 100, because other features, such as conductive lines 125 and vias 124, may be formed in other areas of the memory region 130 for connection to conductive features over and below the memory region 130. In some embodiments, to form the memory devices 123A or 123B, a mask layer, such as a patterned photoresist layer, is formed to cover some areas of the memory region 130, while the memory devices 123A or 123B are formed in other areas of the memory region 130 exposed by the mask layer. After the memory devices 123 are formed, the mask layer is then removed.

Still referring to FIG. 1, after the memory region 130 is formed, an interconnect structure 140, which includes dielectric layer 121 and electrically conductive features (e.g., vias 124 and conductive lines 125) in the dielectric layer 121, is formed over the memory region 130. The interconnect structure 140 may electrically connect the electrical components formed in/on the substrate 101 to form functional circuits. The interconnect structure 140 may also electrically couple the memory devices 123 to the components formed in/on the substrate 101, and/or couple the memory devices 123 to conductive pads formed over the interconnect structure 140 for connection with an external circuit or an external device. Formation of interconnect structure is known in the art, thus details are not repeated here.

In some embodiments, the memory devices 123 are electrically coupled to the electrical components (e.g., transistors) formed on the substrate 50, e.g., by the vias 124 and conductive lines 125, and are controlled or accessed (e.g., written to or read from) by functional circuits of the semiconductor device 100, in some embodiments. In addition, or alternatively, the memory devices 123 are electrically coupled to conductive pads formed over a top metal layer of the interconnect structure 140, in which case the memory devices 123 may be controlled or accessed by an external circuit (e.g., another semiconductor device) directly without involvement of the functional circuits of the semiconductor device 100, in some embodiments. Although additional metal layers (e.g., the interconnect structure 140) are formed over the memory devices 123 in the example of FIG. 1, the memory devices 123 may be formed in a top (e.g., topmost) metal layer of the semiconductor device 100, these and other variations are fully intended to be included within the scope of the present disclosure.

FIGS. 2-8, 9A, 9B, 10, 11, 12A-12E, and 13 illustrate various views (e.g., perspective view, cross-sectional view, top view) of a three-dimensional (3D) ferroelectric random access memory (FeRAM) device 200 at various stages of manufacturing, in an embodiment. For ease of discussion, a 3D FeRAM device may also be referred to as a 3D memory device, or simply a memory device in the discussion herein. The 3D memory device 200 is a three-dimensional memory device with a ferroelectric material. The 3D memory device 200 may be used as the memory device 123A and/or 123B in FIG. 1. Note that for simplicity, not all features of the 3D memory device 200 are illustrated in the figures, and the figures may only show a portion of the 3D memory device 200.

Figure 2:
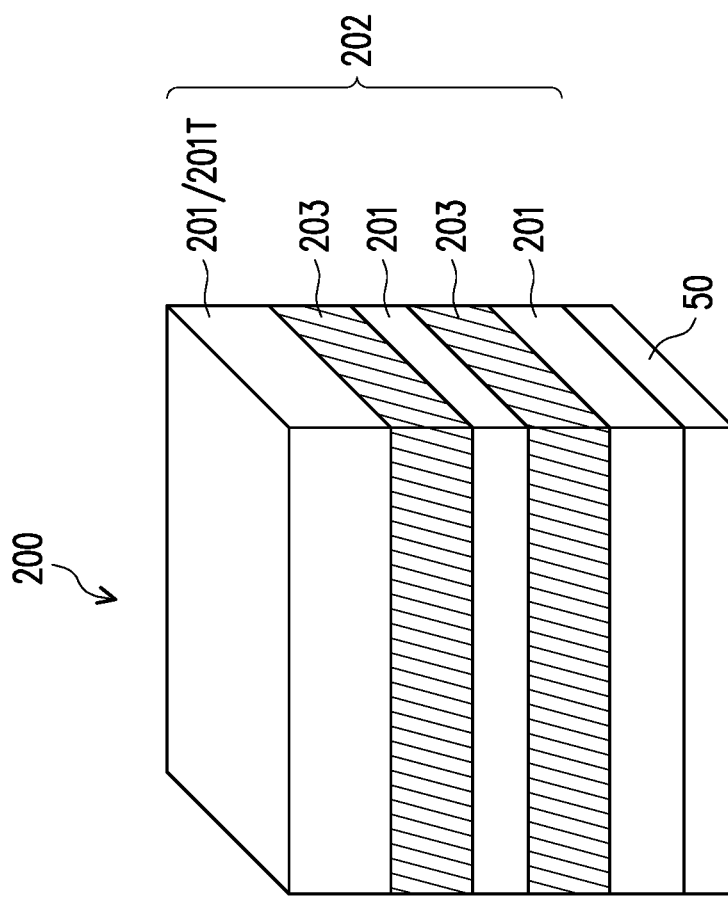

Referring now to FIG. 2, which shows a perspective view of the memory device 200 at an early stage of fabrication. A layer stack 202 is formed over the substrate 50. The layer stack 202 includes alternating layers of a dielectric material 201 and an electrically conductive material 203. Each layer of the dielectric material 201 in the layer stack 202 may also be referred to as a dielectric layer 201, and each layer of the electrically conductive material 203 in the layer stack 202 may also be referred to as an electrically conductive layer 203. As will be discussed hereinafter, the electrically conductive material 203 is used to form word lines (WLs) of the 3D memory device 200, and therefore, may also be referred to as word line material 203.

In some embodiments, to form the layer stack 202, the dielectric layer 201 is first formed by depositing a suitable dielectric material, such as silicon oxide, silicon nitride, or the like, on the substrate 50 using a suitable deposition method, such as PVD, CVD, atomic layer deposition (ALD), or the like. Next, the electrically conductive layer 203 is formed over the dielectric layer 201. In some embodiments, the electrically conductive layer 203 is formed of an electrically conductive material, such as a metal or metal-containing material. Examples materials for the electrically conductive layer 203 include Al, Ti, TiN, TaN, Co, Ag, Au, Cu, Ni, Cr, Hf, Ru, W, Pt, or the like. The electrically conductive layer 203 may be formed by, e.g., PVD, CVD, ALD, combinations thereof, or the like. The above deposition processes repeat, until a target number of layers is formed in the layer stack 202. In the illustrated embodiment, the topmost layer of the layer stack 202 is a dielectric layer 201, which may be referred to as a topmost dielectric layer 201T of the layer stack 202. Note that the number of layers in the layer stack 202 can be any suitable number and is not limited to the example shown in FIG. 2.

Figure 3:
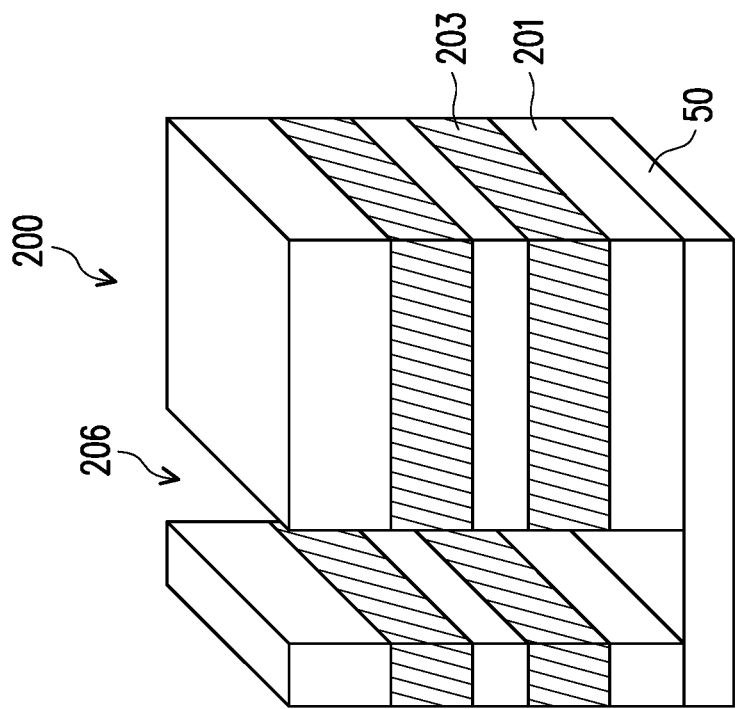
FIGS. 2-8, 9A, 9B, 10, 11, 12A-12E, and 13 illustrate various views of a three-dimensional (3D) ferroelectric random access memory (FeRAM) device at various stages of manufacturing, in an embodiment.

Next, in FIG. 3, first trenches 206 (may also be referred to as openings, recesses, or slots) are formed in the layer stack 202 and extend through the layer stack 202 to expose the substrate 50. The first trenches 206 may be formed using, e.g., photolithography and etching techniques. In the illustrated embodiment, the first trenches 206 extend from a lower surface of the layer stack 202 facing the substrate 50 to an upper surface of the layer stack 202 distal from the substrate 50. In the example of FIG. 3, the first trenches 206 extends continuously between opposing sidewalls of the layer stack 202, such that the first trenches 206 cut through the layer stack 202 and separate the layer stack 202 into a plurality of slices (e.g., fin shaped structures) that are separate (e.g., spaced apart) from each other. Note that for simplicity, FIG. 3 only shows one of the first trenches 206. Referring temporarily to FIG. 9B, FIG. 9B shows a plurality of first trenches 206 interleaved with a plurality of second trenches 212 formed in the layer stack 202 in subsequent processing, where the first trenches 206 and second trenches 212 are filled with other materials (e.g., 205, 207, 209, 211, 213) to form the 3D memory device 200, details of which are discussed hereinafter.

Figure 4:
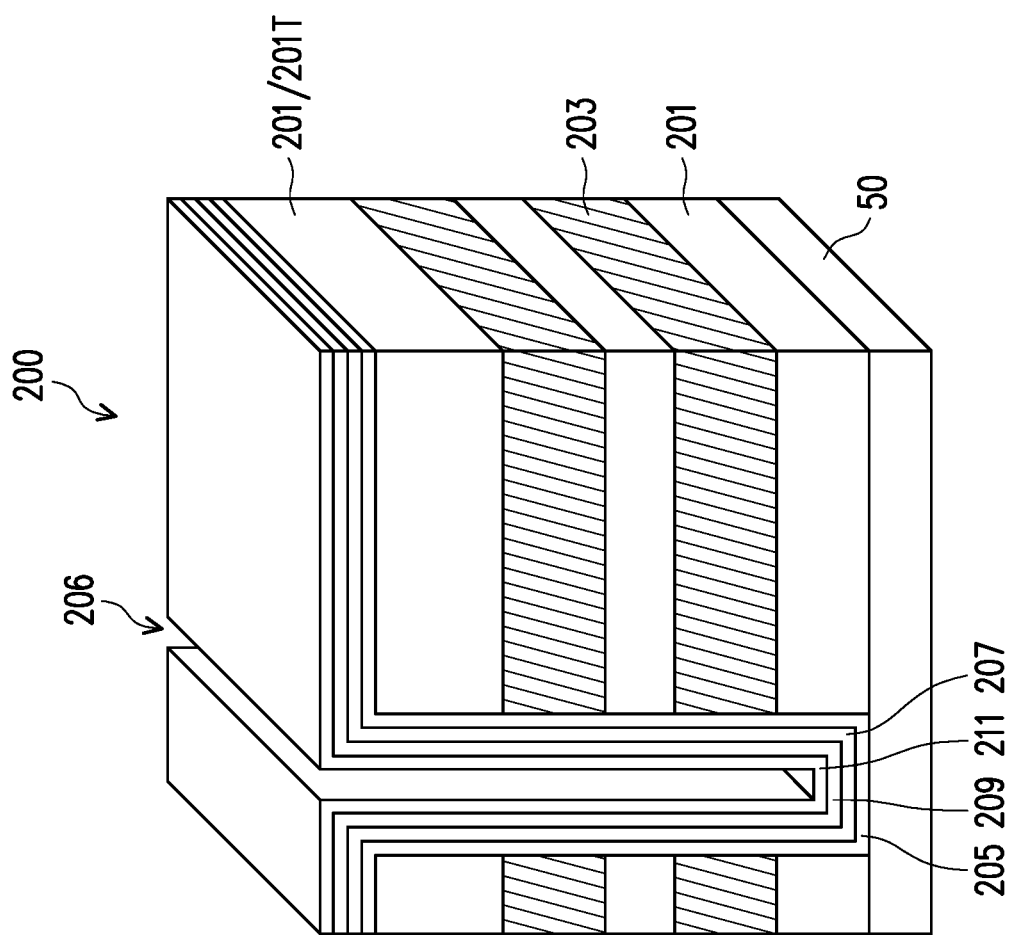

Next, in FIG. 4, a ferroelectric material 205 is formed (e.g., conformally) in the first trenches 206 along sidewalls and bottoms of the first trenches 206. The ferroelectric material 205 may also be formed over the upper surface of the layer stack 202. Next, a channel material 207 is formed (e.g., conformally) over the ferroelectric material 205. Next, a capping layer 209 is formed (e.g., conformally) over the channel material 207, and an oxide liner 211 is formed (e.g., conformally) over the capping layer 209.

In some embodiments, the ferroelectric material 205 comprises $BaTiO_3$, $PbTiO_3$, $PbZrO_3$, $LiNbO_3$, $NaNbO_3$, $KNbO_3$, $KTaO_3$, $BiScO_3$, $BiFeO_3$, $Hf_{1-x}Er_xO$, $Hf_{1-x}La_xO$, $Hf_{1-x}Y_xO$, $Hf_{1-x}Gd_xO$, $Hf_{1-x}Al_xO$, $Hf_{1-x}Zr_xO$, $Hf_{1-x}Ti_xO$, $Hf_{1-x}Ta_xO$, AlScN, the like, combinations thereof, or multi layers thereof, and may be formed by a suitable formation method such as PVD, CVD, ALD, or the like. The ferroelectric material 205 may also be referred to as ferroelectric film.

In some embodiments, the channel material 207 is a semiconductive material, such as amorphous-silicon (a-Si), polysilicon (poly-Si), a semiconductive oxide (e.g., indium gallium zinc oxide (IGZO), indium zinc oxide (IZO), zinc oxide (ZnO), indium tin oxide (ITO), or indium tungsten oxide (IWO)), or the like. The channel material 207 may be formed by, e.g., PVD, CVD, ALD, combinations thereof, or the like.

In some embodiments, the capping layer 209 is formed of a dielectric material. The capping layer 209 functions as a protection layer for the channel material 207 and prevents contaminant elements, such as H, Cl, or F in subsequent processing (e.g., a subsequent etching process), from diffusing into the channel material 207. In an example embodiment, the capping layer 209 is formed of a high-k dielectric material with a dielectric constant (e.g., k-value) larger than, e.g., about 7.0 or even higher. Examples of high-k dielectric material include $HfO_2$, $TiO_2$, HfZrO, $Ta_2O_3$, $HfSiO_4$, $ZrO_2$, $ZrSiO_2$, and other suitable materials. The high-k dielectric material of the capping layer 209 may be formed by atomic layer deposition (ALD) and/or other suitable methods.

In some embodiments, the dielectric constant $K_{cap}$ of the capping layer 209 (e.g., a dielectric material) is higher than the dielectric constant $K_{fer}$ of the ferroelectric material 205 (e.g., $K_{cap} > K_{fer}$) to facilitate reliable switching of the electrical polarization direction of the ferroelectric material 205. As will be discussed in more detail hereinafter, the electrical polarization direction of the ferroelectric material 205 is used to store the digital information (e.g., a bit of 0 or 1) of each memory cell of the 3D memory device 200. The electrical polarization direction of the ferroelectric material 205 is switched by an electrical field applied to the ferroelectric material 205, which electric field may be proportional to a voltage applied across the ferroelectric material 205. Referring temporarily to FIG. 12C, during operation (e.g., a write operation) of a memory cell 225 of the 3D memory device 200, a voltage $V_{total}$ is applied between, e.g., a word line (WL) 203 and a respective source line (SL) 218. The voltage $V_{total}$ is shared by the different layers of materials between the WL 203 and the SL 218, such as the ferroelectric material 205, the channel material 207, and the capping layer 209 in the example of FIG. 12C. In other words, a portion of the voltage $V_{total}$ is applied to each layer (e.g., 205, 207, or 209) of material between the WL 203 and the SL 218. Since the voltage applied to each layer of material is inversely proportional to its dielectric constant, it may be advantageous to choose the dielectric constant $K_{cap}$ of the capping layer 209 to be higher than the dielectric constant $K_{fer}$ of the ferroelectric material 205, such that a substantial percentage of the voltage $V_{total}$ is applied across the ferroelectric material 205 to facilitate switching of the electrical polarization direction of the ferroelectric material 205. For similar reasons, the dielectric constant of the channel material 207 is also chosen to be higher than the dielectric constant $K_{fer}$ of the ferroelectric material 205, in some embodiments. In some embodiments, the dielectric constant $K_{cap}$ of the capping layer 209 is chosen to be twice, five times, ten times, or more than the dielectric constant $K_{fer}$ of the ferroelectric material 205. High dielectric constant materials, such as $AlO_x$ (with k-value between about 9 and about 11), $HfO_x$ (with k-value between about 25 and about 27), and $TaO_2$ (with k-value between about 40 and 80) may therefore be advantageously used as the material for the capping layer 209, especially in applications where the voltage $V_{total}$ is low. In other embodiments, the dielectric constant $K_{cap}$ of the capping layer 209 may be substantially equal to, or smaller than, the dielectric constant $K_{fer}$ of the ferroelectric material 205, e.g., in applications where the voltage $V_{total}$ is high enough such that the voltage applied across the ferroelectric material 205 is higher than the switching voltage for the ferroelectric material 205.

Still referring to FIG. 4, the oxide liner 211 comprises an oxide, such as silicon oxide, and is formed by a suitable formation method, such as ALD, or the like, in some embodiments. The oxide liner 211 protects, e.g., sidewall portions of the ferroelectric material 205, the channel material 207, and the capping layer 209 in a subsequent etching process (see FIG. 5), in some embodiments.

Figure 5:
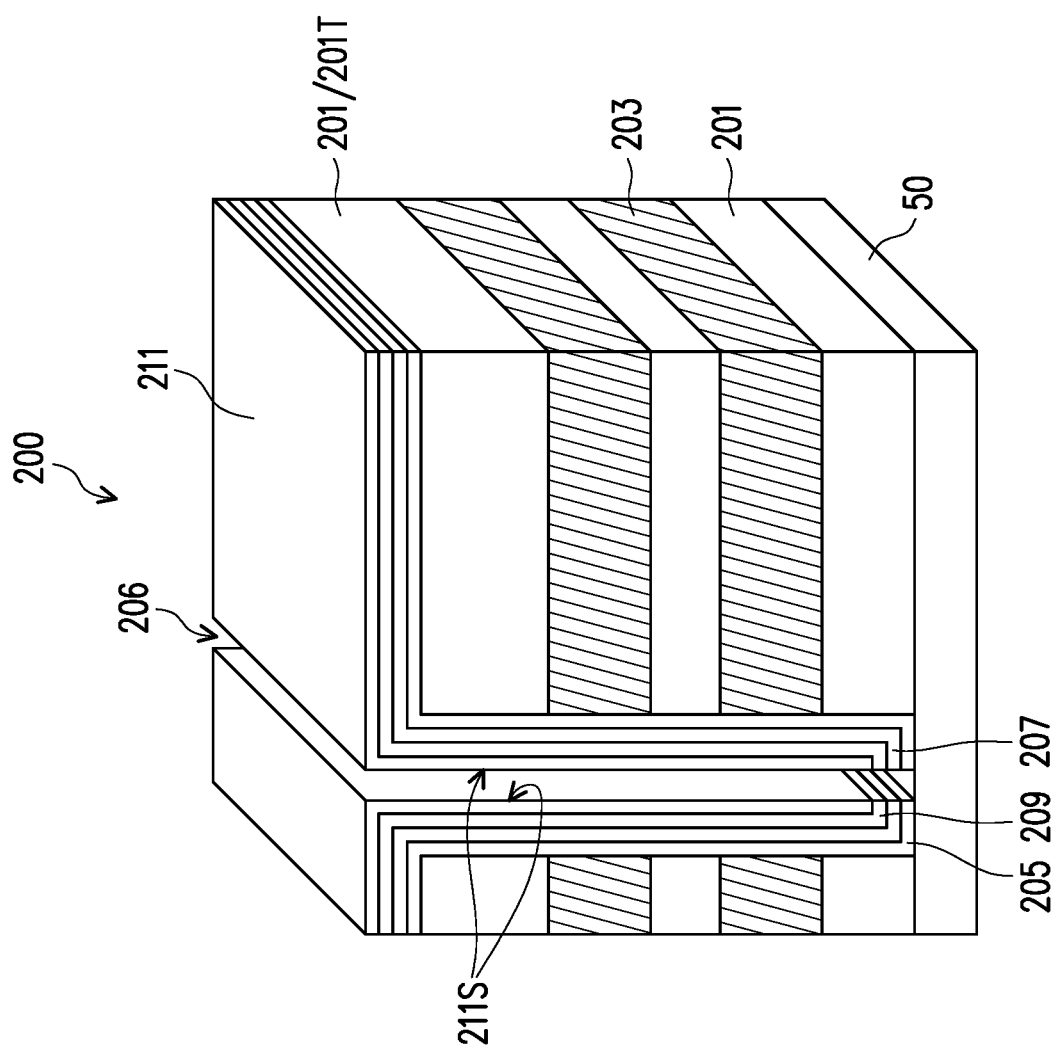

Next, in FIG. 5, a suitable etching process, such as an anisotropic etching process, is performed to remove first portions of the oxide liner 211, first portions of the capping layer 209, first portions of the channel material 207, and first portions of the ferroelectric material 205 from bottoms of the first trenches 206, and as a result, the upper surface of the substrate 50 is exposed at the bottom of the first trenches 206. In the illustrated embodiment, due to the anisotropicity of the etching process, second portions of the oxide liner 211, second portions of the capping layer 209, second portions of channel material 207, and second portions of the ferroelectric material 205 disposed between the layer stack 202 and sidewalls 211S of the oxide liner 211 facing the first trench 206 remain after the anisotropic etching process. Note that the second portions of the capping layer 209, the second portions of channel material 207, and the second portions of the ferroelectric material 205 have L-shaped cross-sections, and have bottom portions that are disposed between the second portions of the oxide liner 211 and the substrate 50. As illustrated in FIG. 5, each of the sidewalls 211S of the oxide liner 211 is vertically aligned (e.g., in a same vertical plane in FIG. 5) with respective sidewalls of the second portions of the capping layer 209, the second portions of the channel material 207, and the second portions of the ferroelectric material 205.

Figure 6:
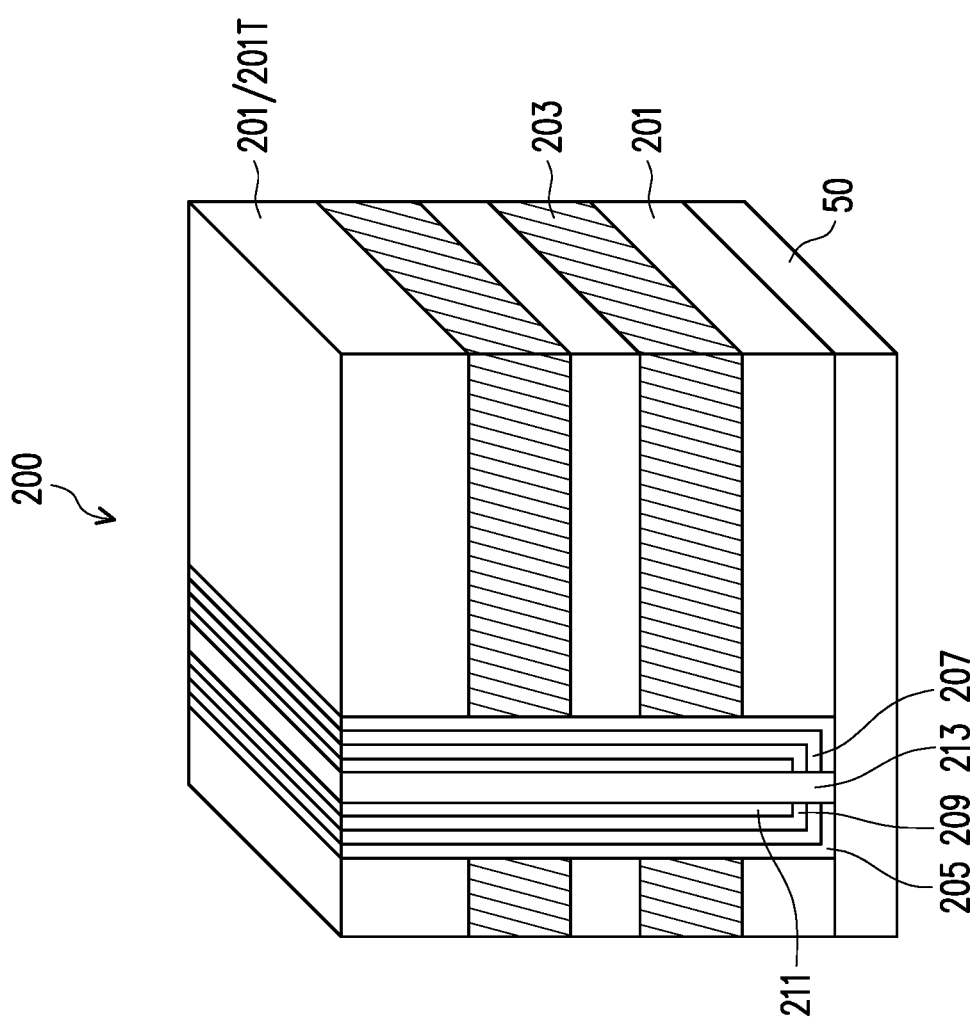

Next, in FIG. 6, a dielectric material 213 is formed in the first trenches 206 to fill the remaining space in the first trenches 206. In some embodiments, the dielectric material 213 is formed by depositing a suitable dielectric material, such as silicon oxide, silicon nitride, or the like, using a suitable deposition method, such as ALD, or the like. The dielectric material 213 may overfill the first trenches 206 and may be formed over the upper surface of the layer stack 202. Next, a planarization process, such as chemical mechanical planarization (CMP), is performed to remove excess portions of the ferroelectric material 205, the channel material 207, the capping layer 209, the oxide liner 211, and the dielectric material 213 from the upper surface of the layer stack 202. As illustrated in FIG. 6, after the planarization process, remaining portions of the ferroelectric material 205, the channel material 207, and the capping layer 209 have L-shaped cross-sections.

Figure 7:
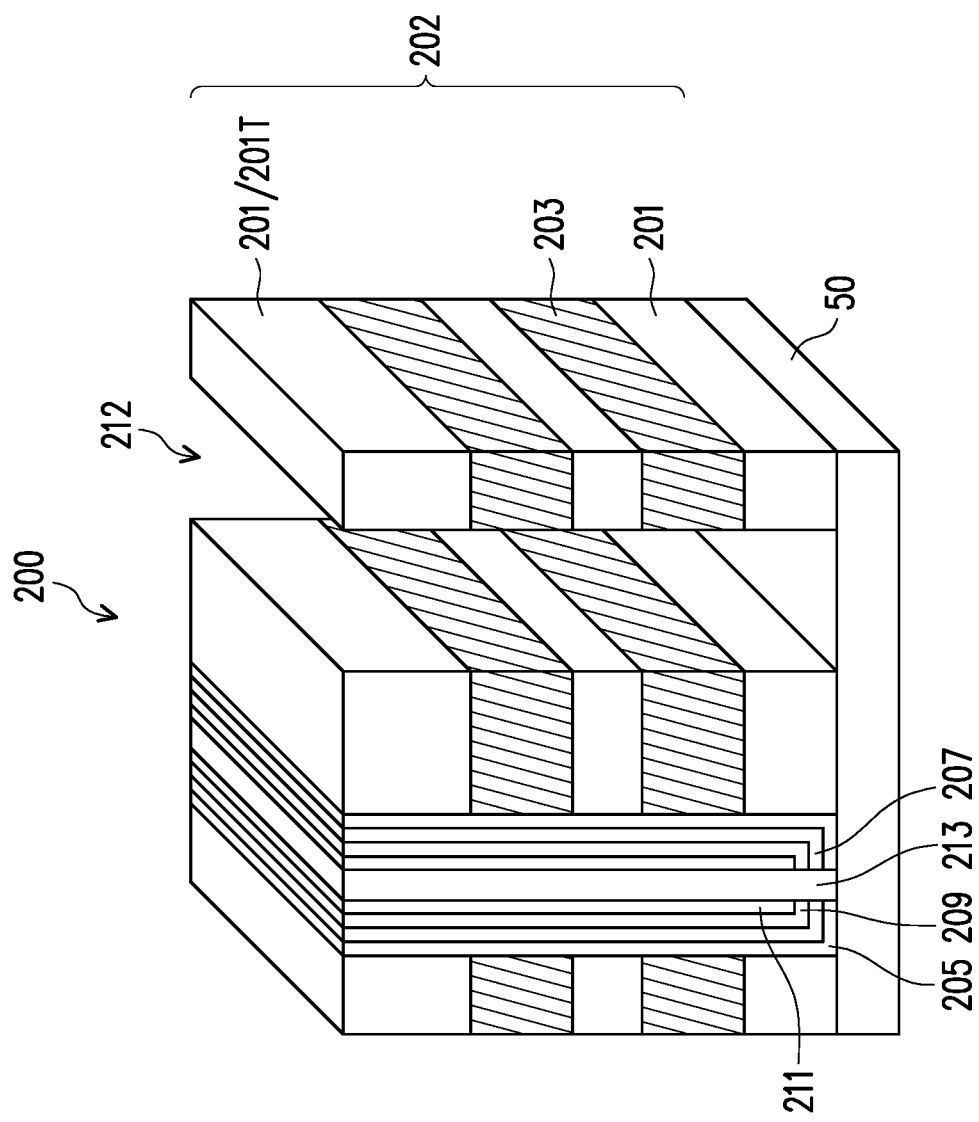

Next, in FIG. 7, second trenches 212 are formed in the layer stack 202. The second trenches 212 are similar to the first trenches 206 and may be formed using a same or similar method. For simplicity, FIG. 7 shows only one second trench 212. FIG. 9B illustrates a plurality of second trenches 212 in the layer stack 202 that are interleaved with the first trenches 206. As illustrated in FIG. 9B, the first trenches 206 and the second trenches 212 are formed alternately in the layer stack 202.

Figure 8:
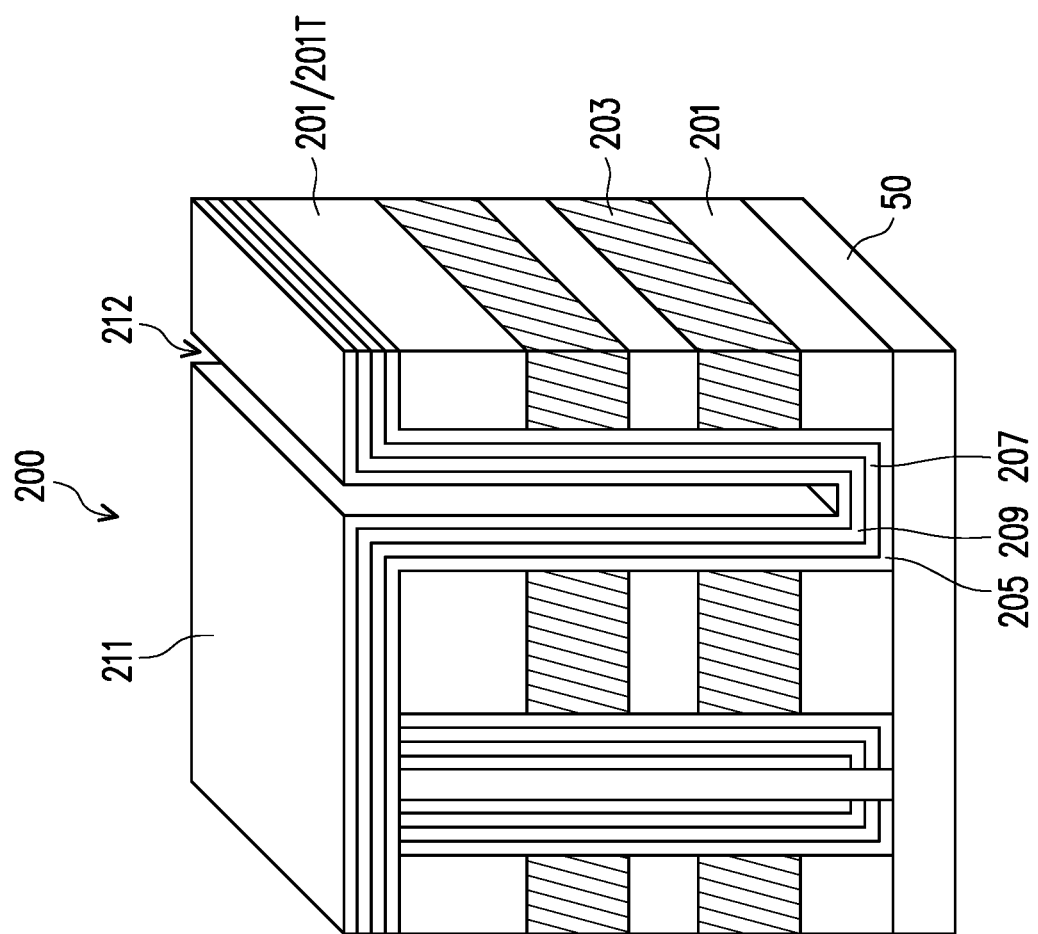

Next, in FIG. 8, the ferroelectric material 205, the channel material 207, the capping layer 209, and the oxide liner 211 are formed (e.g., conformally) successively in the second trenches 212. The materials and the formation methods of the ferroelectric material 205, the channel material 207, the capping layer 209, and the oxide liner 211 may be the same as or similar to those discussed above with reference to FIG. 4, thus details are not repeated.

Figure 9A:
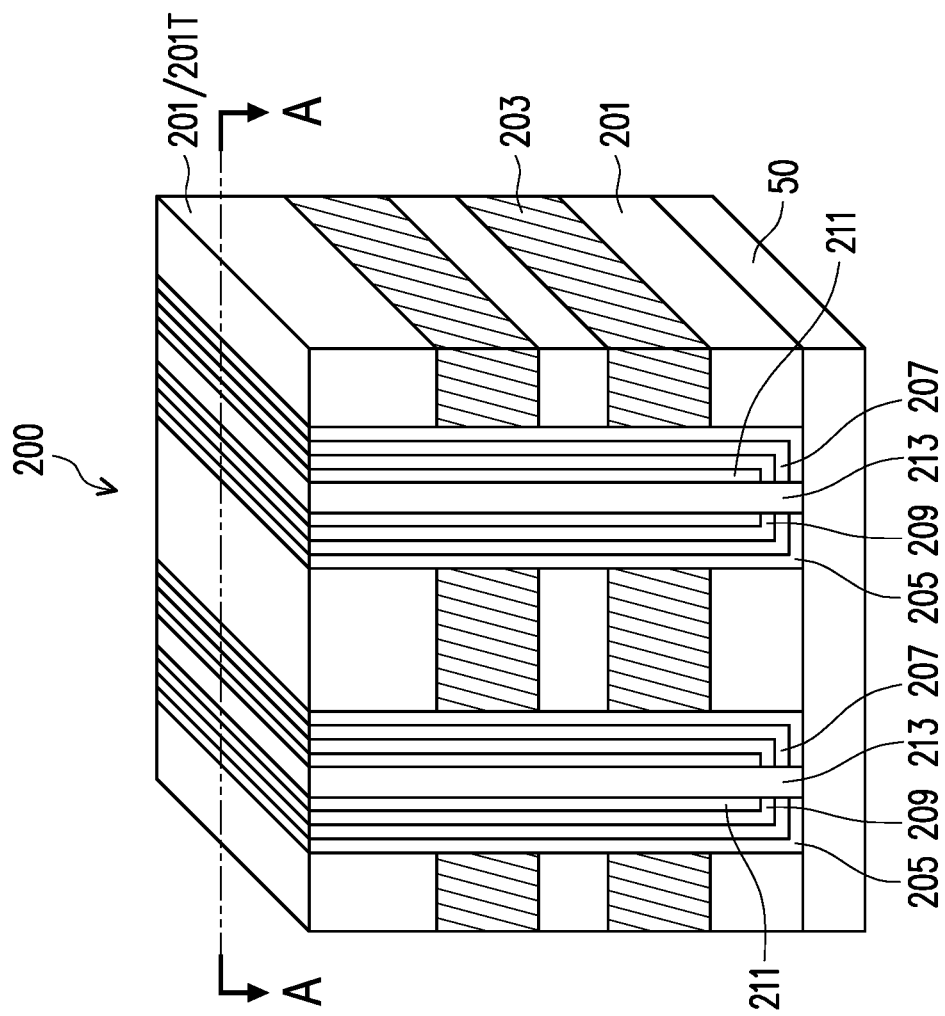
Figure 9B:
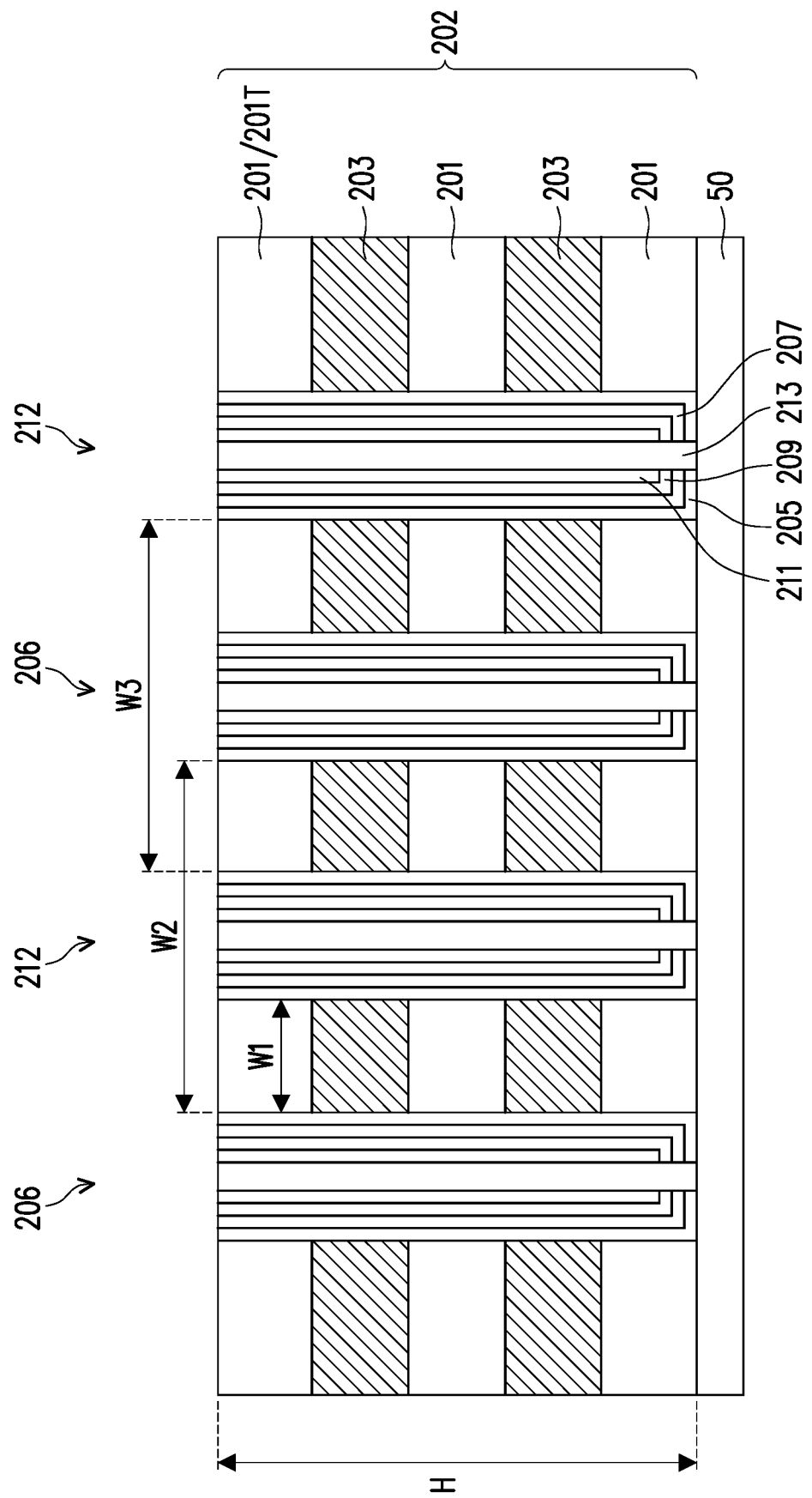

Next, in FIG. 9A, a suitable etching process, such as an anisotropic etching process, is performed to remove portions of the dielectric material 213, portions of the oxide liner 211, portions of the capping layer 209, portions of the channel material 207, and portions of the ferroelectric material 205 from bottoms of the second trenches 212. Details of the etching process may be the same as or similar to those discussed above with reference to FIGS. 5, thus details are not repeated.

Next, the dielectric material 213 is formed in the second trenches 212 and completely fills the second trenches 212. A planarization process, such as CMP, is performed next to remove excess portions of the oxide liner 211, the capping layer 209, the channel material 207, and the ferroelectric material 205 from the upper surface of the layer stack 202.

FIG. 9B illustrates a cross-sectional view of the 3D memory device 200 of FIG. 9A along cross-section A-A. Note that FIG. 9B illustrates a larger portion of the 3D memory device 200 than FIG. 9A, and therefore, shows a plurality of first trenches 206 interleaved with a plurality of second trenches 212. The first trenches 206 and the second trenches 212 in FIG. 9B are filled with various layers of materials (e.g., 205, 207, 209, 211, and 213) for forming memory cells in subsequent processing. The first trenches 206 and the second trenches 212 may be collectively referred to as trenches 206/212.

The disclosed method forms the structure of FIGS. 9A and 9B by forming first trenches 206 (e.g., using lithography and etching techniques), filling the trenches 206 (e.g., by deposition of layers of materials 205/207/209/211/213), forming the second trenches 212 (e.g., using lithography and etching techniques), and filling the second trenches 212 (e.g., by deposition of layers of materials 205/207/209/211/213). Therefore, the disclosed method may also be referred to as a Litho-Etch-Dep-Litho-Etch-Dep (LEDLED) method. Compared with a reference method where the first trenches 206 and the second trenches 212 are formed at the same time (e.g., by a same etching process), the disclosed LEDLED method allows trenches 206/212 to be formed closer to each other without suffering from the "fin collapsing" issue discussed below, thereby enabling memory cells to be formed in higher density than otherwise achievable.

As semiconductor manufacturing process continues to advance, feature size continues to shrink in order to achieve higher integration density. To increase the memory cell density of the 3D memory device 200, it may be advantageous to form the layer stack 202 with a large number of layers (e.g., 201, 203), and to form the trenches 206/212 with smaller distance W1 between adjacent ones of the trenches 206/212. If the trenches 206/212 are formed at the same time, then the portions of layer stack 202 disposed between adjacent ones of the trenches 206/212 (which may be referred to as fin shaped structures of the layer stack 202) have a high aspect ratio of H/W1, where H is the height of the layer stack 202. Fin shaped structures of the layer stack 202 with high aspect ratio may collapse during subsequent processing, causing defects in the 3D memory device 200. In contrast, by using the disclosed LEDLED method, the aspect ratio of the fin shaped structures when forming the first trenches 206 is H/W2, which is much lower than H/W1, because the distance W2 between adjacent ones of the first trenches 206 is larger than W1. Similarly, when forming the second trenches 212, the first trenches 206 are already filled, the aspect ratio of the fin shaped structure (which includes the filled trenches 206) is H/W3 and is much lower than H/W1. As a result, the fin collapsing issue related with high aspect ratio is reduce or avoided by the disclosed LEDLED method, and device reliability and production yield are improved.

Figure 10:
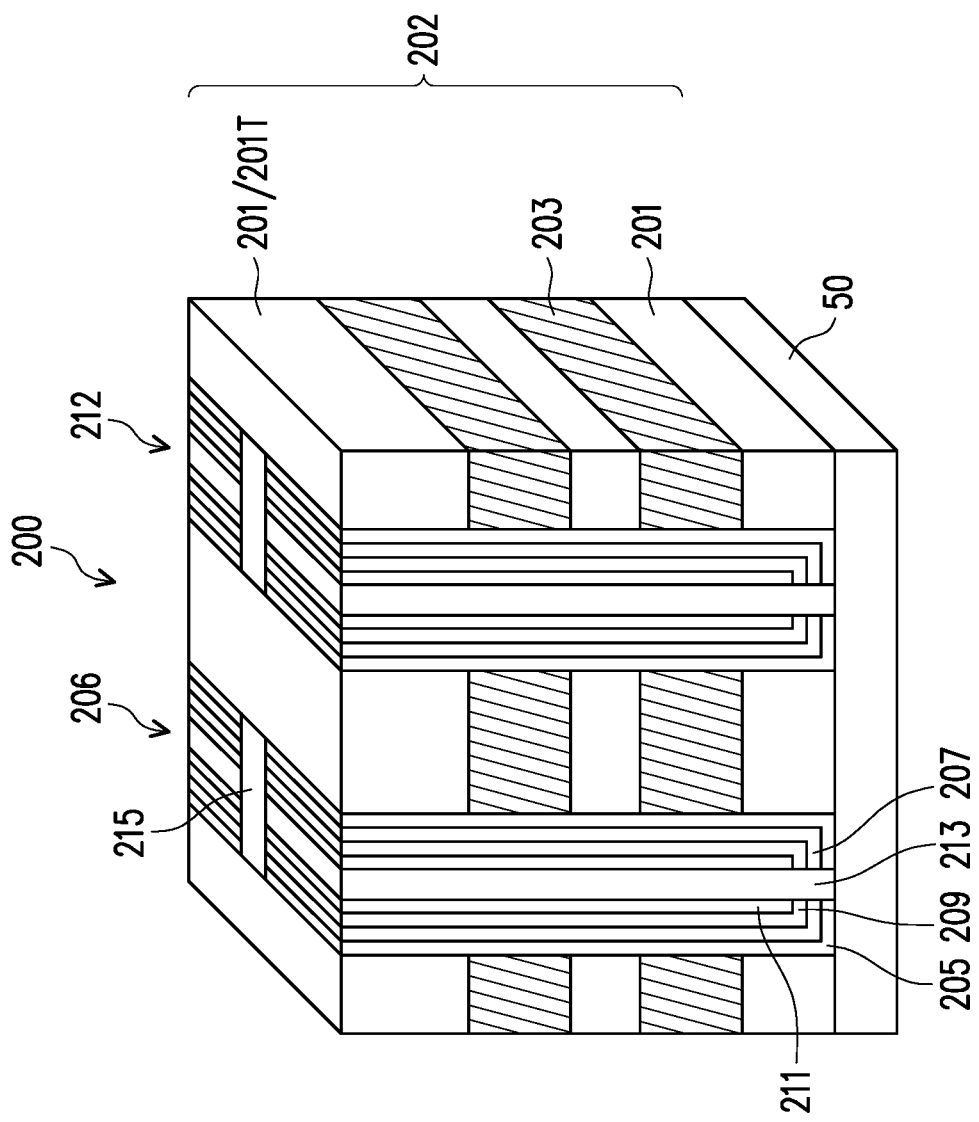

Next, in FIG. 10, isolation regions 215 are formed in the trenches 206/212 and extend vertically through the layer stack 202. The isolation regions 215 may also be referred to as memory cell isolation regions 215, or dielectric plugs 215. In some embodiments, to form the isolation regions 215, a patterned mask is formed over the upper surface of the layer stack 202, where patterns (e.g., openings) of the patterned mask layer correspond to locations of the isolation regions 215. Next, an anisotropic etching process is performed using the patterned mask layer as an etching mask to form openings in the layer stack 202 that extend vertically through the layer stack 202. Next, the openings in the layer stack 202 are filled with a dielectric material, such as silicon oxide, silicon nitride, or the like, using a suitable formation method such as CVD, PVD, ALD, or the like. A planarization process, such as CMP, may be performed next to remove excessive portions of the dielectric material from the upper surface of the layer stack 202, and remaining portions of the dielectric material in the openings form the isolation regions 215.

In the example of FIG. 10, a width of the isolation regions 215 is substantially the same as a width of a respective trench 206/212 that the isolation region 215 is in, such that each isolation region 215 in the respective trench 206/212 physically contacts sidewalls of the layer stack 202 facing the respective trench. In other embodiments, the width of the isolation region 215 may be smaller than the width of the trench 206/212, and each isolation region 215 in a trench 206/212 extends continuously between sidewalls of the ferroelectric material 205 in the trench. In other words, each isolation region 215 physically contacts opposing sidewalls of the ferroelectric material 205 in the trench, but does not extend through the ferroelectric material 205.

Figure 11:
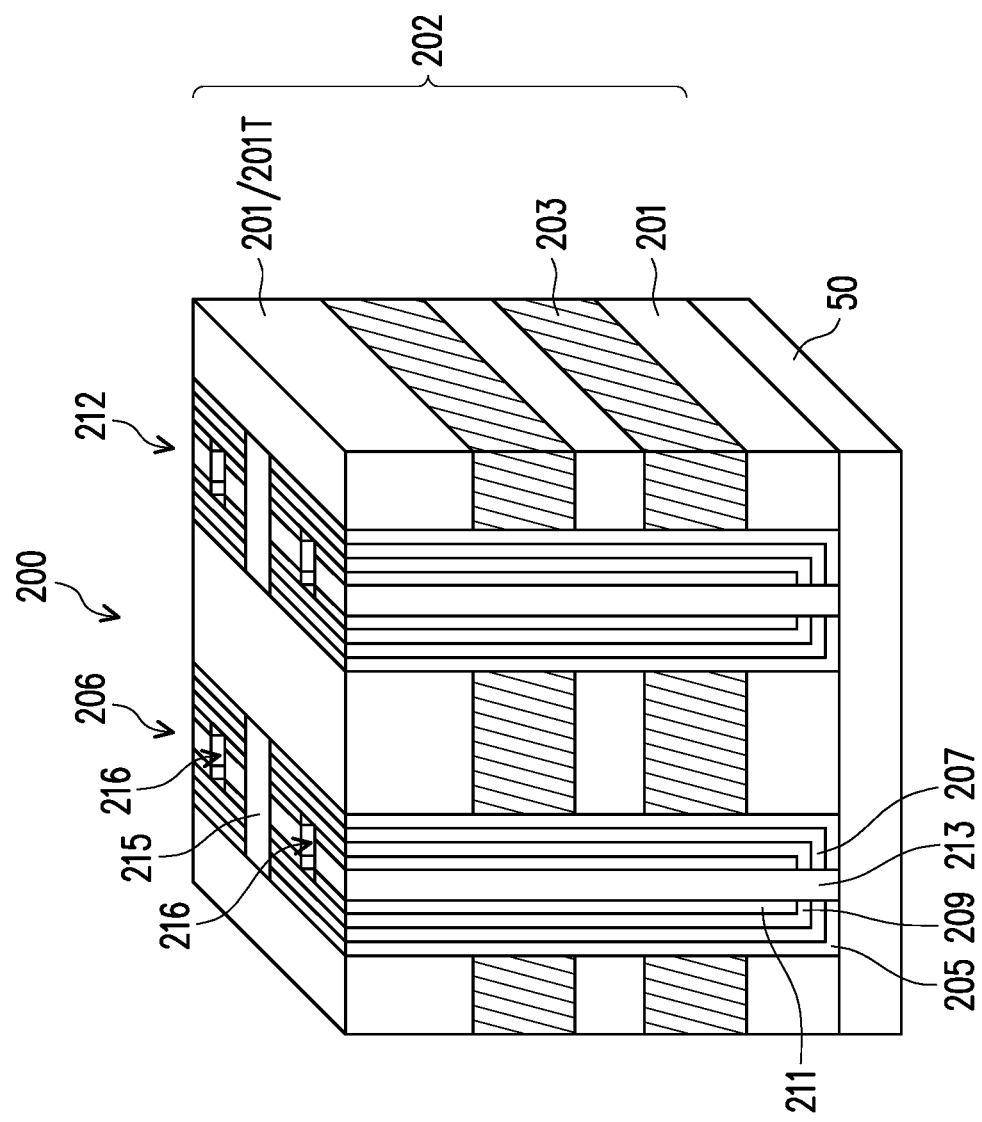

Next, in FIG. 11, openings 216 are formed (e.g., by photolithography and etching techniques) in the oxide liner 211 and the dielectric material 213, which openings 216 extend from the upper surface of the layer stack 202 facing away from the substrate 50 to the lower surface of the layer stack 202 facing the substrate 50. The openings 216 expose sidewalls of the capping layer 209, in the example of FIG. 11. The openings 216 are filled with electrically conductive material(s) (e.g., 217, 219) to form source lines (SLs) 218S and bit lines (BLs) 218B in subsequent processing. In other embodiments, the openings 216 are formed to be wider than the opening 216 of FIG. 11, and exposes the sidewalls of the channel material 207 (see FIG. 15), or exposes the sidewalls of the ferroelectric material 205 (see FIG. 14).

Figure 12A:
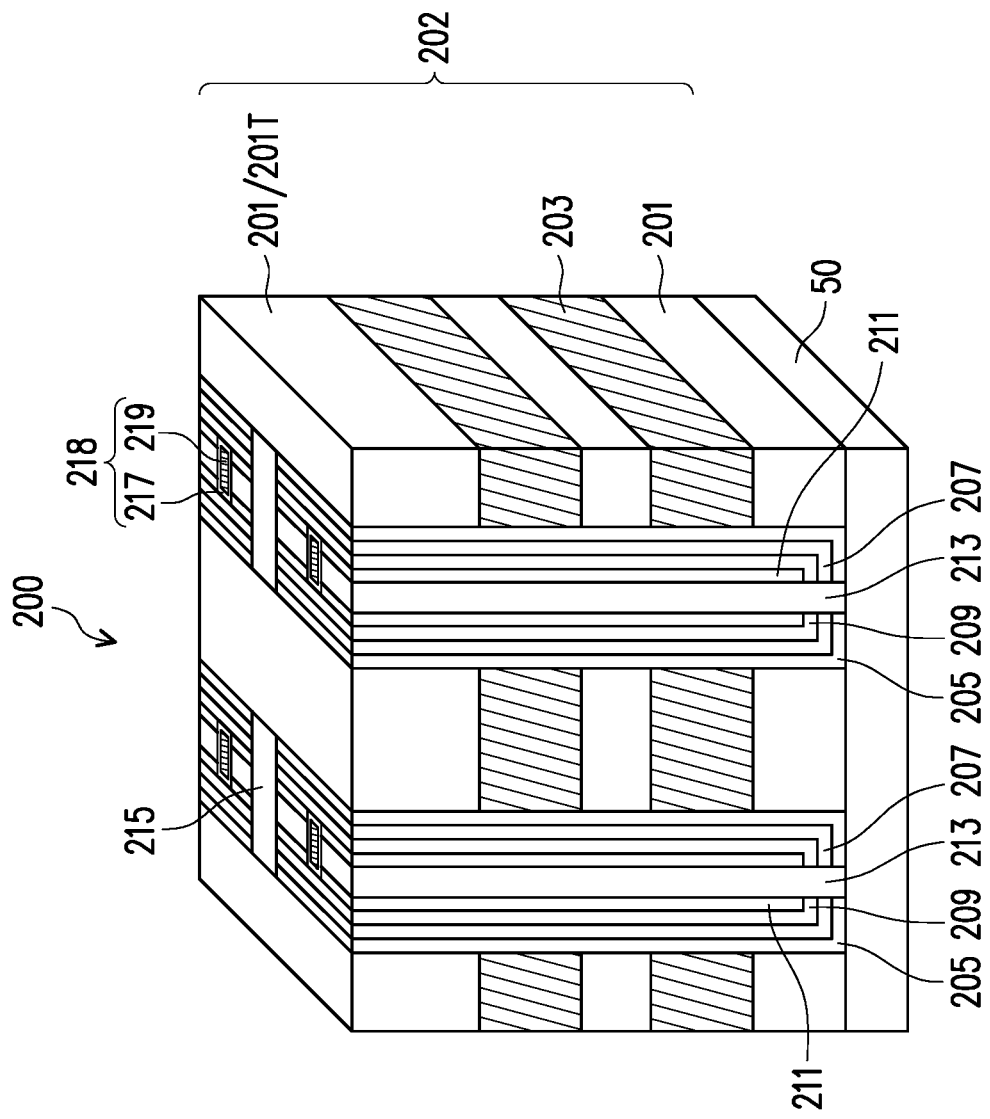

Next, in FIG. 12A, a barrier layer 217 is formed (e.g., conformally) in the openings 216 to line sidewalls and bottoms of the openings 216. The barrier layer 217 may comprise titanium nitride, although other suitable material, such as tantalum nitride, titanium, tantalum, or the like, may also be used. A suitable formation method, such as CVD, ALD, or the like, may be performed to form the barrier layer 217. Next, an anisotropic etching process, which is optional, is performed to remove portions of the barrier layer 217 from the bottoms of the openings 216, such that the substrate 50 is exposed at the bottom of the openings 216. Next, an electrically conductive material 219, such as Al, Ti, TiN, TaN, Co, Ag, Au, Cu, Ni, Cr, Hf, Ru, W, Pt, or the like, is formed to fill the openings 216. A planarization process, such as CMP, may be performed next to remove excess portions of the barrier layer 217 and excess portions of the electrically conductive material 219 from the upper surface of the layer stack 202. Remaining portions of the barrier layer 217 and remaining portions of the electrically conductive material 219 in the openings 216 form conductive lines 218. The conductive lines 218 are metal columns or metal pillar that extends vertically through the layer stack 202, in the illustrated embodiments. The conductive lines 218 may also be referred to as the source lines (SLs) 218S or bit lines (BLs) 218B of the 3D memory device 200.

Figure 12B:
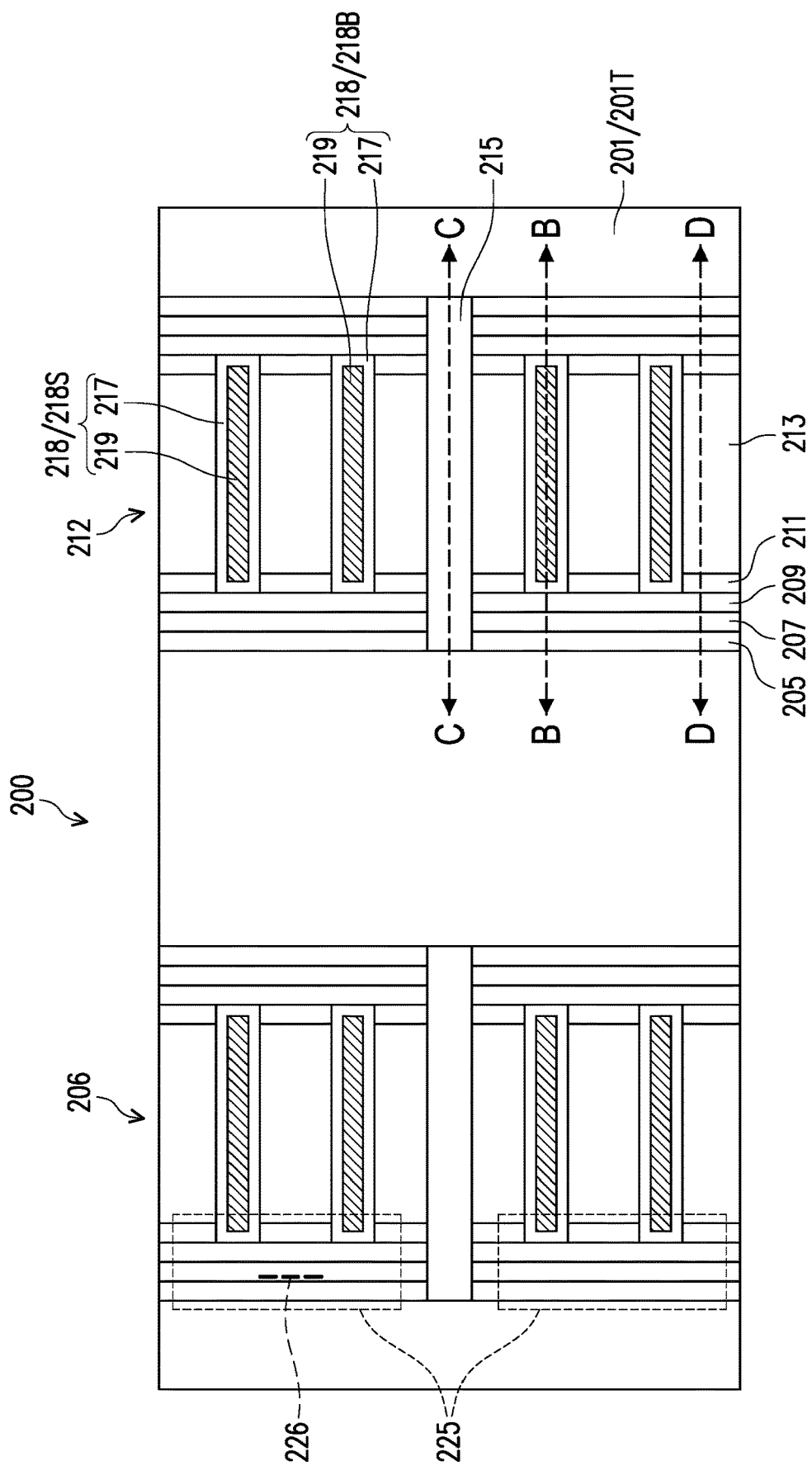
Figure 12D:
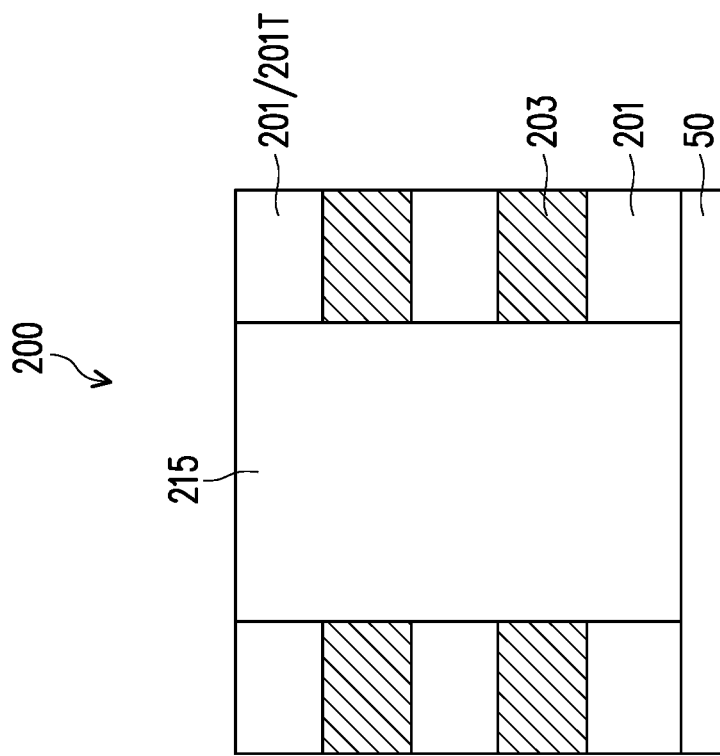
Figure 12C:
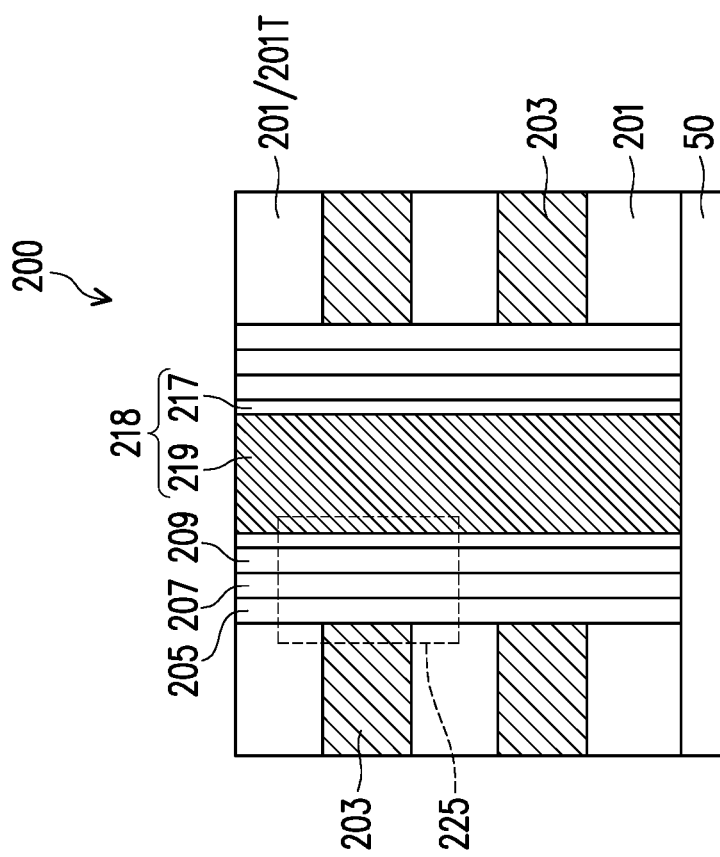
Figure 12E:
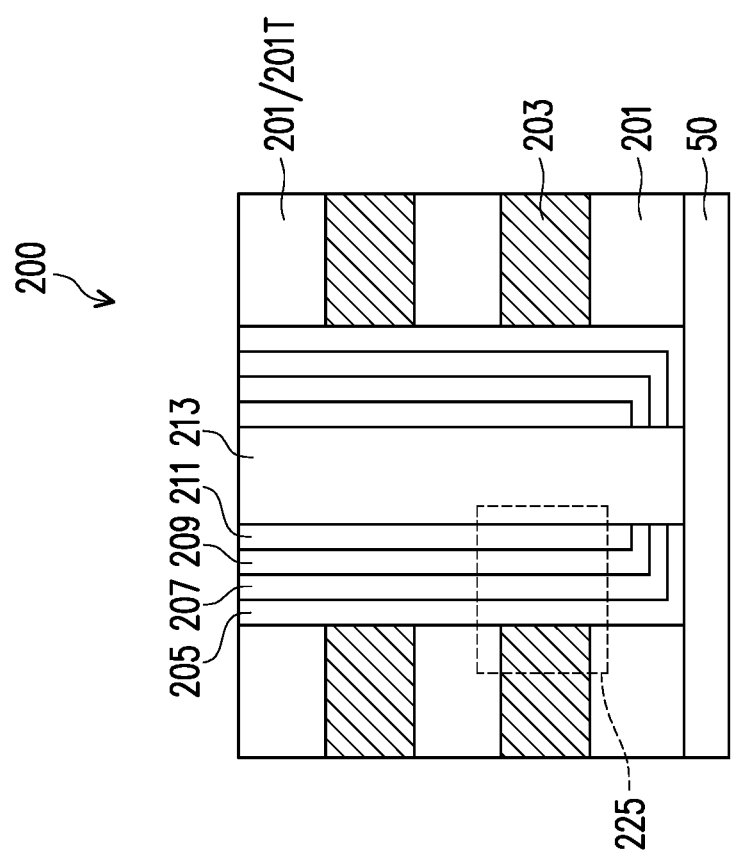

FIG. 12B illustrates a top view of the memory device 200 of FIG. 12A. FIGS. 12C, 12D, and 12E illustrate cross-sectional views of the memory device 200 of FIG. 12B along cross-sections B-B, C-C, and D-D, respectively. Note that for clarity, FIGS. 12B, 12C, 12D, and 12E may illustrate a portion of the 3D memory device 200 that is larger or smaller than the portion of 3D memory device 200 illustrated in FIG. 12A.

As illustrated in the top view of FIG. 12B, each isolation region 215 extends continuously from a first sidewall of the layer stack 202 (e.g., a first sidewall of the topmost dielectric layer 201T of the layer stack 202) to a second sidewall of the layer stack 202 (e.g., a second sidewall of the topmost dielectric layer 201T of the layer stack 202) facing the first sidewall of the layer stack 202, where the first sidewall and the second sidewall of the layer stack 202 are sidewalls of the layer stack 202 exposed by a same trench 206/212. In other words, a width of the isolation region 215, measured along the horizontal direction of FIG. 12B, is the same as a distance between inner sidewalls of the layer stack 202 exposed by a same trench and facing each other. In addition, each of the conductive lines 218 extends continuously from a first sidewall of the capping layer 209 to a second sidewall of the capping layer 209 facing the first sidewall of the capping layer 209. In other words, a width of the conductive line 218, measured along the horizontal direction of FIG. 12B, is the same as a distance between inner sidewalls of the capping layer 209 in a trench and facing each other.

In FIG. 12B, a few, but not all, of the memory cells 225 of the 3D memory device 200 are highlighted by dashed boxes. Memory cells 225 are also highlighted by dashed boxes in FIGS. 12C and 12E. As illustrated in FIGS. 12A-12E, each memory cell 225 is a transistor with an embedded ferroelectric film 205. Within each memory cell 225, the electrically conductive layer 203 (see, e.g., FIG. 12C) functions as the gate electrode of the transistor, the conductive lines 218S and 218B (see, e.g., FIG. 12B) function as the source/drain regions of the transistor, and the channel material 207 functions as the channel layer between the source/drain regions. The dashed line 226 in FIG. 12B illustrates the channel region formed in the channel material 207 during operation of the 3D memory device 200, e.g., when a voltage is applied at the gate of the transistor and causes the transistor to be turned on. The electrical polarization direction of the ferroelectric film 205 in each memory cell 225 indicates the digital information (e.g., a "o" or "i") stored in the memory cell 225, and determines the threshold voltage of the transistor of the memory cell 225, more details are discussed hereinafter.

In the context of memory devices, the electrically conductive layer 203 (e.g., the gate electrode) in each memory cell 225 is referred to as the word line (WL) of the memory cell, the conductive lines 218S and 218B (e.g., the source/drain regions) may be referred to as the source line (SL) and the bit line (BL) of the memory cell.

As illustrated in FIG. 12A, each of the electrically conductive layers 203 (e.g., WL) of the memory device 200 electrically connects multiple memory cells formed along a same horizontal plane (e.g., at a same vertical distance from the substrate 50). In addition, as illustrated in FIG. 12C, each SL or BL 218 electrically connects multiple vertically stacked memory cells 225. Therefore, the disclosed 3D memory device 200 achieves efficient sharing of the WLs, BLs, and SLs among multiple memory cells 225, and the 3D structure of the memory cells 225 allows for multiple layers of the memory cells 225 to be stacked easily together to form high density memory arrays.

FIGS. 12C and 12E illustrate different shapes for the cross-sections of the ferroelectric material 205, the channel material 207, and the capping layer 209 at different locations of the 3D memory device 200. For example, in FIG. 12E, which illustrates the cross-section along a vertical plane (vertical to the upper surface of the substrate 50) cutting across the dielectric material 213 (e.g., along cross-section D-D in FIG. 12B), the ferroelectric material 205, the channel material 207, and the capping layer 209 have L-shaped cross-sections. In FIG. 12C, which illustrates the cross-section along a vertical plane (vertical to the upper surface of the substrate 50) cutting across the conductive lines 218 (e.g., along cross-section B-B in FIG. 12B), the ferroelectric material 205, the channel material 207, and the capping layer 209 have rectangular shaped cross-sections.

Referring to FIGS. 12A-12E, to perform a write operation on a particular memory cell 225, a write voltage is applied across a portion of the ferroelectric material 205 within the memory cell 225. The write voltage may be applied, for example, by applying a first voltage to the gate electrode 203 of the memory cell 225, and applying a second voltage to the source/drain regions 218S/218B. The voltage difference between the first voltage and the second voltage sets the polarization direction of the ferroelectric material 205. Depending on the polarization direction of the ferroelectric material 205, the threshold voltage VT of the corresponding transistor of the memory cell 225 can be switched from a low threshold voltage VL to a high threshold voltage VH, or vice versa. The threshold voltage value (VL or VH) of the transistor can be used to indicate a bit of "0" or a "1" stored in the memory cell.

To perform a read operation on the memory cell 225, a read voltage, which is a voltage between the low threshold voltage VL and the high threshold voltage VH, is applied to the gate electrode 203. Depending on the polarization direction of the ferroelectric material 205 (or the threshold voltage VT of the transistor), the transistor of the memory cells 225 may or may not be turned on. As a result, when a voltage is applied, e.g., between the source/drain regions 218S and 218B, an electrical current may or may not flow between the source/drain regions 218S and 218B. The electrical current may thus be detected to determine the digital bit stored in the memory cell.

Figure 13:
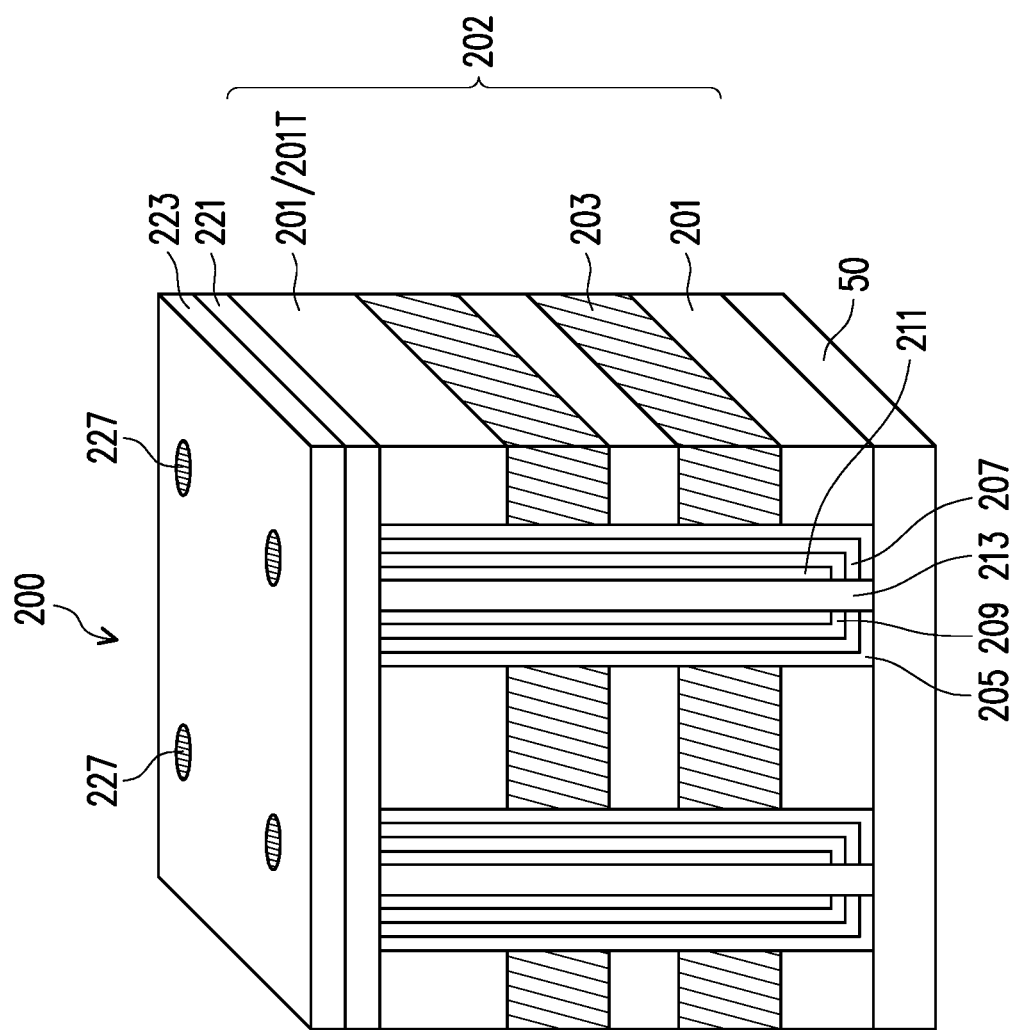

Next, in FIG. 13, contacts 227 are formed over the layer stack 202 to electrically couple to the conductive lines 218. To form the contacts 227, dielectric layers 221 and 223 are formed over the layer stack 202. Openings are formed in the dielectric layers 221 and 223 to expose underlying conductive lines 218. An electrically conductive material(s) is formed in the openings to form the contacts 227.

In some embodiments, the dielectric layer 221 is formed of silicon nitride, although other suitable dielectric layer, such as silicon oxynitride, silicon carbide, may also be used. The dielectric layer 221 may be formed by, e.g., CVD, ALD, or the like. The dielectric layer 223 may be formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. The openings in the dielectric layers 221 and 223 may be formed by photolithography and etching techniques. The electrically conductive material(s) filling the opening may be any suitable conductive material, such as Al, Ti, TiN, TaN, Co, Ag, Au, Cu, Ni, Cr, Hf, Ru, W, Pt, or the like.

Additional processing may be performed to finish the 3D memory device 200, as skilled artisans readily appreciate. For example, contacts may be formed to electrically couple to the WLs 203, and portions of the layer stack 202 may be removed to form a stair-case shaped region to facilitate formation of the contacts coupled to the WLs. For simplicity, details are not discussed here.

Figure 14:
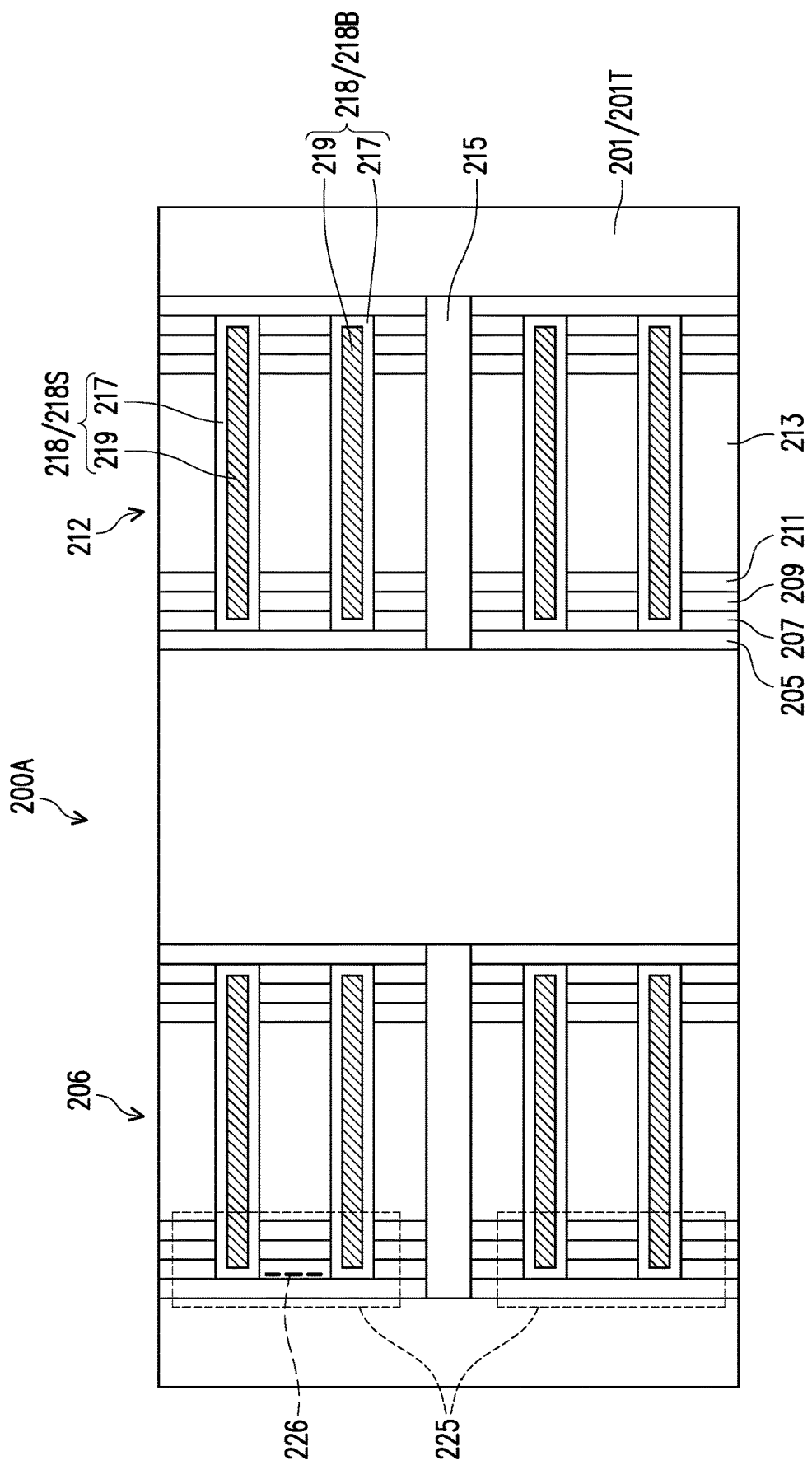
FIG. 14 illustrates a top view of a three-dimensional (3D) ferroelectric random access memory (FeRAM) device, in another embodiment.

FIG. 14 illustrates a top view of a three-dimensional (3D) ferroelectric random access memory (FeRAM) device 200A, in another embodiment. The 3D memory device 200A is similar to the 3D memory device 200 of FIG. 12B and may be formed by similar processing steps, but the SL 218S and BLs 218B are wider than those in FIG. 12B and extend to (e.g., physically contact) sidewalls of the ferroelectric material 205 in a respective trench 206/212.

Figure 15:
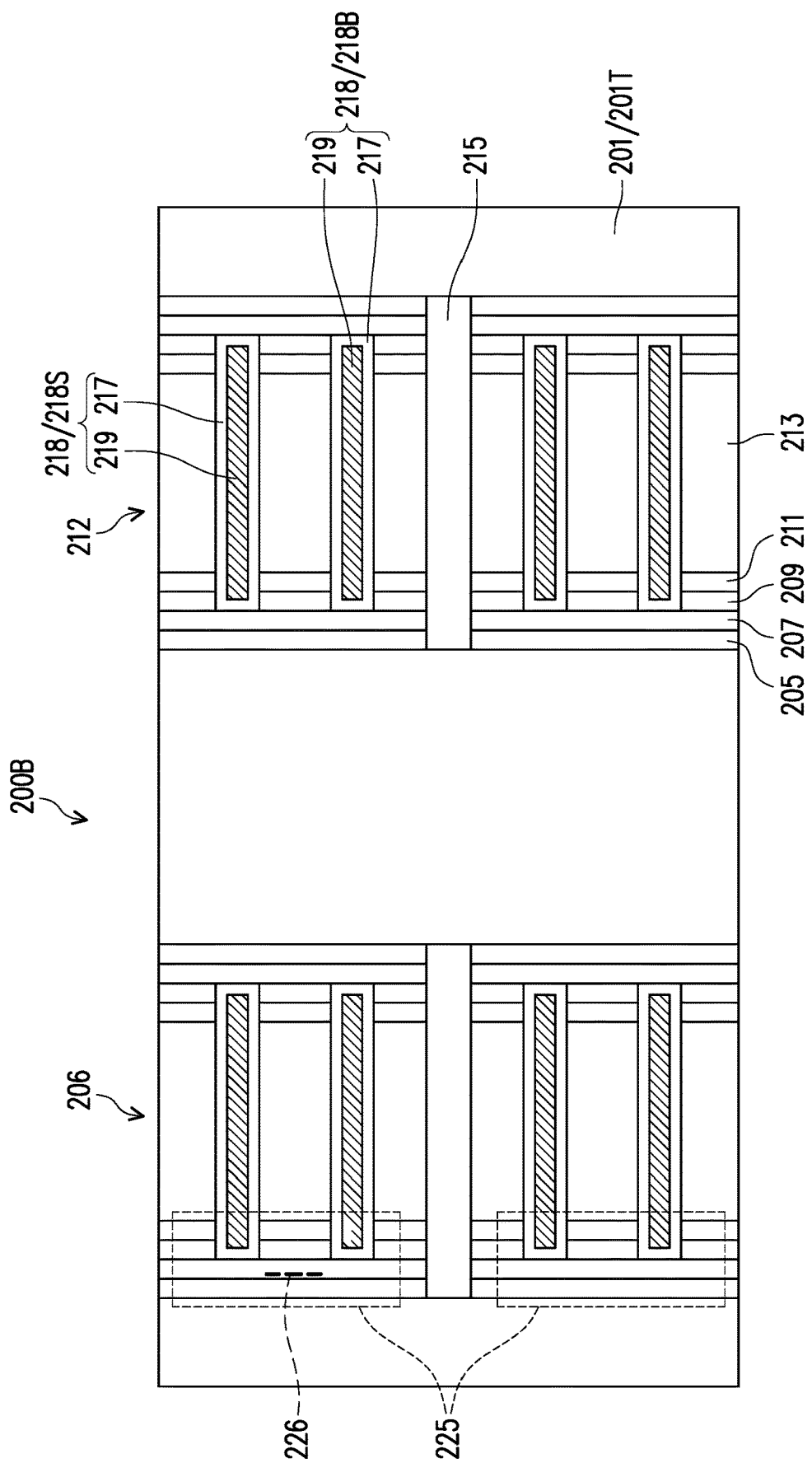
FIG. 15 illustrates a top view of a three-dimensional (3D) ferroelectric random access memory (FeRAM) device, in yet another embodiment.

FIG. 15 illustrates a top view of a three-dimensional (3D) ferroelectric random access memory (FeRAM) device 200B, in yet another embodiment. The 3D memory device 200B is similar to the 3D memory device 200 of FIG. 12B and may be formed by similar processing steps, but the SL 218S and BLs 218B in FIG. 15 are wider than those in FIG. 12B and narrower than those in FIG. 14, and extend to (e.g., physically contact) sidewalls of the channel material 207 in a respective trench 206/212.

Embodiments may achieve advantages. For example, the disclosed LEDLED method, by forming first trenches 206 and the second trenches 212 in different processing steps, avoids or reduces the fin structure collapsing problem. As a result, device reliability and production yield are improved.

Figure 16:
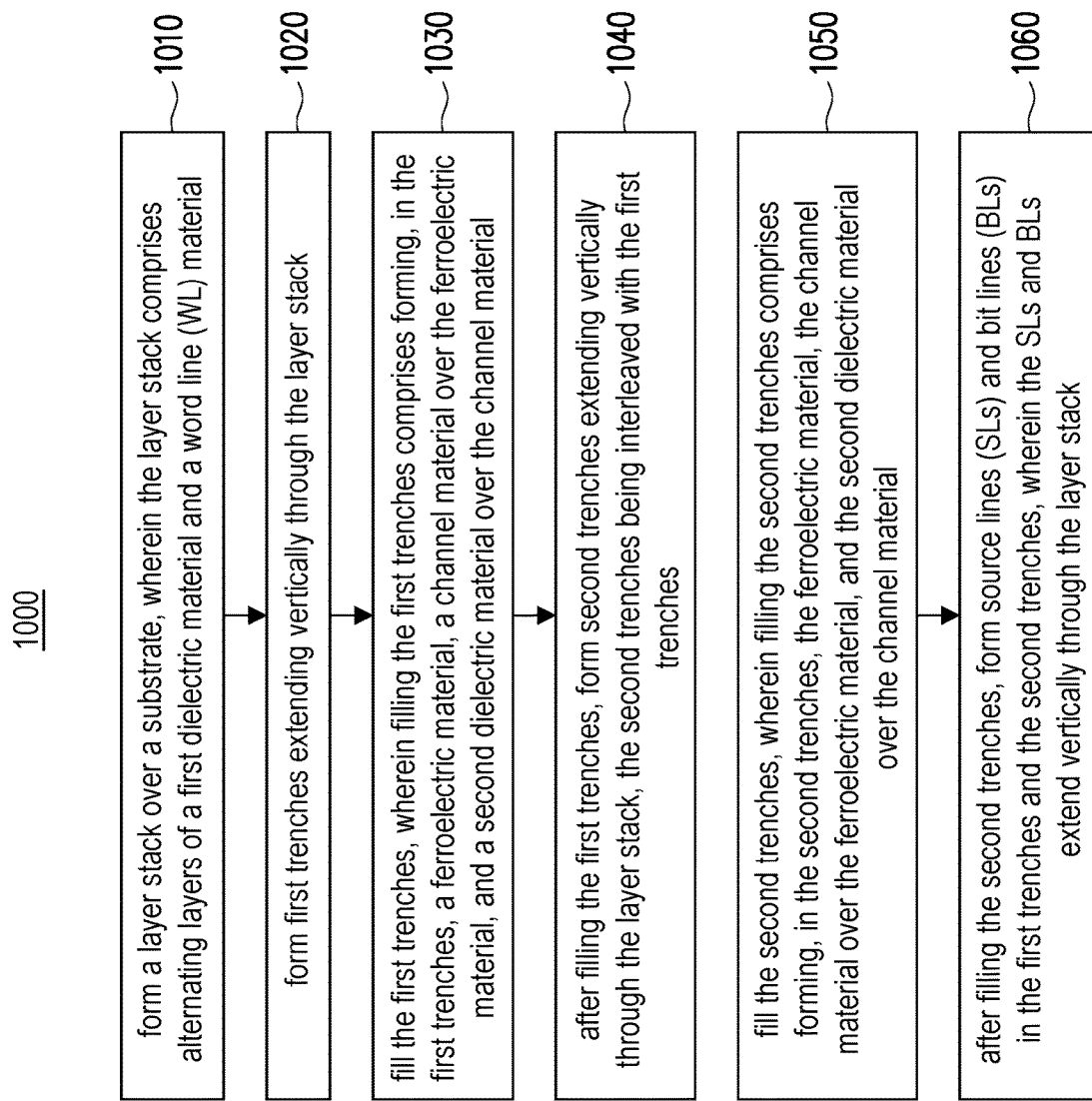
FIG. 16 illustrates a flow chart of a method of forming a three-dimensional (3D) ferroelectric random access memory (FeRAM) device, in some embodiments.

FIG. 16 illustrates a flow chart of a method 1000 of forming a three-dimensional (3D) ferroelectric random access memory (FeRAM) device, in some embodiments. It should be understood that the embodiment method shown in FIG. 16 is merely an example of many possible embodiment methods. One of ordinary skill in the art would recognize many variations, alternatives, and modifications. For example, various steps as illustrated in FIG. 16 may be added, removed, replaced, rearranged, or repeated.

Referring to FIG. 16, at block 1010, a layer stack is formed over a substrate, wherein the layer stack comprises alternating layers of a first dielectric material and a word line (WL) material. At block 1020, first trenches are formed to extend vertically through the layer stack. At block 1030, the first trenches are filled, wherein filling the first trenches comprises forming, in the first trenches, a ferroelectric material, a channel material over the ferroelectric material, and a second dielectric material over the channel material.

At block 1040, after filling the first trenches, second trenches are formed to extend vertically through the layer stack, the second trenches being interleaved with the first trenches. At block 1050, the second trenches are filled, wherein filling the second trenches comprises forming, in the second trenches, the ferroelectric material, the channel material over the ferroelectric material, and the second dielectric material over the channel material. At block 1060, after filling the second trenches, source lines (SLs) and bit lines (BLs) are formed in the first trenches and the second trenches that extend vertically through the layer stack.

In accordance with an embodiment, a method of forming a ferroelectric random access memory (FeRAM) device includes: forming a layer stack over a substrate, wherein the layer stack comprises alternating layers of a first dielectric material and a word line (WL) material; forming first trenches extending vertically through the layer stack from an upper surface of the layer stack distal from the substrate to a lower surface of the layer stack facing the substrate; lining bottoms and sidewalls of the first trenches with a ferroelectric material; forming a channel material in the first trenches over the ferroelectric material; filling the first trenches with a second dielectric material; after filling the first trenches, forming second trenches extending vertically through the layer stack, wherein the second trenches are interleaved with the first trenches; lining bottoms and sidewalls of the second trenches with the ferroelectric material; forming the channel material in the second trenches over the ferroelectric material; filling the second trenches with the second dielectric material; and after filling the second trenches, forming source lines (SLs) and bit lines (BLs) in the first trenches and the second trenches, wherein the SLs and BLs extend vertically through the layer stack. In an embodiment, the WL material is an electrically conductive material, and the channel material is a semiconductive oxide. In an embodiment, the channel material comprises indium gallium zinc oxide, indium zinc oxide, zinc oxide, indium tin oxide, or indium tungsten oxide. In an embodiment, the method further includes: after forming the channel material in the first trenches and before filling the first trenches, forming a capping layer in the first trenches over the channel material, wherein the capping layer is a dielectric material, wherein a dielectric constant of the capping layer is higher than a dielectric constant of the ferroelectric material; and after forming the channel material in the second trenches and before filling the second trenches, forming the capping layer in the second trenches over the channel material. In an embodiment, the capping layer is formed of a high-k dielectric material. In an embodiment, forming the SLs and BLs comprises: forming openings in the first trenches and the second trenches, wherein the openings extend vertically through the layer stack; forming a barrier layer along sidewalls of the openings; and filling the openings with an electrically conductive material. In an embodiment, the SLs and the BLs extend continuously between, and contact, opposing sidewalls of the capping layer facing each other. In an embodiment, the SLs and the BLs extend continuously between, and contact, opposing sidewalls of the channel material facing each other. In an embodiment, the SLs and the BLs extend continuously between, and contact, opposing sidewalls of the ferroelectric material facing each other. In an embodiment, the method further includes: after forming the capping layer in the first trenches and before filling the first trenches, forming an oxide liner in the first trenches over the capping layer. In an embodiment, the method further includes: after forming the oxide liner in the first trenches and before filling the first trenches, performing an anisotropic etching process to remove portions of the oxide liner, portions of the capping layer, portions of the channel material, and portions of the ferroelectric material from the bottoms of the first trenches. In an embodiment, the method further include forming isolation regions in the first trenches and in the second trenches between the BLs and the SLs, wherein the isolation regions extend vertically through the layer stack, and wherein in a top view, each of the isolation regions extends through the ferroelectric material in a respective trench of the first trenches and the second trenches.

In accordance with an embodiment, a method of forming a ferroelectric random access memory (FeRAM) device includes: forming a layer stack over a substrate, wherein the layer stack comprises alternating layers of a first dielectric material and a word line (WL) material; forming first trenches extending vertically through the layer stack; filling the first trenches, wherein filling the first trenches comprises forming, in the first trenches, a ferroelectric material, a channel material over the ferroelectric material, and a second dielectric material over the channel material; after filling the first trenches, forming second trenches extending vertically through the layer stack, the second trenches being interleaved with the first trenches; and filling the second trenches, wherein filling the second trenches comprises forming, in the second trenches, the ferroelectric material, the channel material over the ferroelectric material, and the second dielectric material over the channel material. In an embodiment, filling the first trenches further comprises forming a capping layer in the first trenches between the channel material and the second dielectric material, wherein the capping layer is formed of a third dielectric material having a dielectric constant higher than that of the ferroelectric material. In an embodiment, filling the first trenches further comprises: forming an oxide liner in the first trenches between the capping layer and the second dielectric material; and before forming the second dielectric material in the first trenches, removing portions of the oxide liner, portions of the capping layer, portions of the channel material, and portions of the ferroelectric material from the bottoms of the first trenches by performing an anisotropic etching process. In an embodiment, the method further includes, after filling the second trenches, forming source lines (SLs) and bit lines (BLs) in the first trenches and the second trenches, wherein the SLs and BLs extend vertically through the layer stack, wherein forming the SLs and BLs comprises: forming openings in the first trenches and the second trenches, the openings extending vertically through the layer stack; lining sidewalls and bottoms of the openings with a barrier layer; and filling the openings with an electrically conductive material. In an embodiment, the method further includes forming isolation regions between the SLs and BLs, wherein forming the isolation regions comprises: forming openings in the second dielectric material; and filling the openings with a third dielectric material, the third dielectric material in the openings forming the isolation regions, wherein each of the isolation regions extends continuously from a first sidewall of a respective trench to a second opposing sidewall of the respective trench.

In accordance with an embodiment, a ferroelectric random access memory device includes: a layer stack over a substrate, the layer stack comprising alternating layers of a first dielectric material and a word line (WL) material; a dielectric layer embedded in the layer stack and extending from an upper surface of the layer stack distal to the substrate to a lower surface of the layer stack facing the substrate; a ferroelectric film between the dielectric layer and the layer stack, the ferroelectric film disposed on opposing sides of the dielectric layer; a channel layer between the ferroelectric film and the dielectric layer; a capping layer between the channel layer and the dielectric layer, wherein the capping layer is a dielectric material having a first dielectric constant higher than a second dielectric constant of the ferroelectric film; and source lines (SLs) and bit lines (BLs) embedded at least partially in the dielectric layer and extending through the layer stack. In an embodiment, the WL material is an electrically conductive material, and the channel layer is a semiconductive oxide. In an embodiment, the ferroelectric random access memory device further includes an oxide liner between the capping layer and the dielectric layer, wherein a first portion of the ferroelectric film, a second portion of the channel layer, and a third portion of the capping layer are disposed between the oxide liner and the substrate, wherein a sidewall of the oxide liner facing the dielectric layer is in a same plane with a first sidewall of the first portion of the ferroelectric film, a second sidewall of the second portion of the channel layer, and a third sidewall of the third portion of the capping layer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a ferroelectric random access memory (FeRAM) device, the method comprising:
   forming a layer stack over a substrate, wherein the layer stack comprises alternating layers of a first dielectric material and a first electrically conductive material;
   forming first trenches extending vertically through the layer stack;
   conformally forming a ferroelectric material along bottoms and sidewalls of the first trenches;
   forming a channel material in the first trenches over the ferroelectric material;
   filling the first trenches with a second dielectric material;
   after filling the first trenches, forming second trenches extending vertically through the layer stack, wherein locations of the second trenches are interleaved with locations of the first trenches;
   conformally forming the ferroelectric material along bottoms and sidewalls of the second trenches;
   forming the channel material in the second trenches over the ferroelectric material;
   filling the second trenches with the second dielectric material; and
   after filling the second trenches, forming source lines (SLs) and bit lines (BLs) in the first trenches and in the second trenches, wherein the SLs and BLs extend vertically through the layer stack.

2. The method of claim 1, wherein a dielectric constant of the channel material is higher than that of the ferroelectric material.

3. The method of claim 1, further comprising, after forming the channel material in the first trenches and before filling the first trenches:
   forming a capping layer in the first trenches over the channel material, wherein the capping layer is formed of a third dielectric material.

4. The method of claim 3, wherein a dielectric constant of the third dielectric material is higher than that of the ferroelectric material.

5. The method of claim 3, further comprising, after forming the capping layer in the first trenches and before filling the first trenches:
   forming an oxide liner in the first trenches over the capping layer.

6. The method of claim 5, further comprising, after forming the oxide liner and before filling the first trenches:
   performing an anisotropic etching process, wherein the anisotropic etching process removes portions of the oxide liner, portions of the capping layer, portions of the channel material, and portions of the ferroelectric material from the bottoms of the first trenches.

7. The method of claim 1, wherein the channel material comprises indium gallium zinc oxide, indium zinc oxide, zinc oxide, indium tin oxide, or indium tungsten oxide.

8. The method of claim 1, further comprising:
   forming isolation regions in the first trenches and the second trenches, wherein the isolation regions are formed between the BLs and the SLs, wherein the isolation regions extend vertically through the layer stack.

9. The method of claim 8, wherein each of the isolation regions is formed to extend continuously from a first sidewall of a respective trench to a second opposing sidewall of the respective trench.

10. The method of claim 1, wherein forming the SLs and BLs comprises:
    forming openings in the first trenches and the second trenches, wherein the openings extend vertically through the layer stack; and
    filling the openings with a second electrically conductive material.

11. The method of claim 8, wherein in a top view, a first width of an isolation region of the isolation regions, measured along a first direction between a first sidewall of the isolation region and a second opposing sidewall of the isolation region, is larger than a second width of an SL of the SLs measured along the first direction between a first sidewall of the SL and a second opposing sidewall of the SL, wherein the first sidewall of the isolation region and the second opposing sidewall of the isolation region contact the layer stack.

12. A method of forming a ferroelectric random access memory (FeRAM) device, the method comprising:
    forming a layer stack over a substrate, wherein the layer stack comprises alternating layers of a first dielectric material and an electrically conductive material;
    forming first trenches extending vertically through the layer stack;
    filling the first trenches, wherein filling the first trenches comprises forming a ferroelectric material, a channel material, and a second dielectric material in the first trenches sequentially;
    after filling the first trenches, forming second trenches extending vertically through the layer stack, the second trenches and the first trenches being formed at alternating locations in the layer stack; and
    filling the second trenches, wherein filling the second trenches comprises forming the ferroelectric material, the channel material, and the second dielectric material in the second trenches sequentially.

13. The method of claim 12, further comprising, after filling the second trenches, forming source lines (SLs) and bit lines (BLs) in the first trenches and the second trenches, wherein the SLs and BLs extend vertically through the layer stack.

14. The method of claim 13, further comprising forming isolation regions between the SLs and BLs, wherein forming the isolation regions comprises:

forming openings in the filled first trenches and in the filled second trenches, wherein each of the openings exposes a first sidewall of a respective trench and a second opposing sidewall of the respective trench; and filling the openings with a third dielectric material.

15. The method of claim 12, wherein the channel material has a higher dielectric constant than the ferroelectric material.

16. The method of claim 12, wherein filling the first trenches further comprises forming a capping layer in the first trenches between the channel material and the second dielectric material, wherein the capping layer is formed of a third dielectric material having a dielectric constant higher than that of the ferroelectric material.

17. The method of claim 16, wherein filling the first trenches further comprises, before forming the second dielectric material in the first trenches:

removing portions of the capping layer, portions of the channel material, and portions of the ferroelectric material from the bottoms of the first trenches by performing an anisotropic etching process.

18. A ferroelectric random access memory device comprising:

a layer stack over a substrate, the layer stack comprising alternating layers of a first dielectric material and an electrically conductive material;

a dielectric layer embedded in the layer stack and extending vertically through the layer stack;

a ferroelectric film between the dielectric layer and the layer stack, the ferroelectric film disposed on opposing sides of the dielectric layer;

a channel layer between the ferroelectric film and the dielectric layer, wherein the channel layer has a first dielectric constant higher than a second dielectric constant of the ferroelectric film; and source lines (SLs) and bit lines (BLs) embedded at least partially in the dielectric layer and extending through the layer stack.

19. The ferroelectric random access memory device of claim 18, further comprising a capping layer between the channel layer and the dielectric layer, wherein the capping layer has a third dielectric constant higher than the second dielectric constant of the ferroelectric film.

20. The ferroelectric random access memory device of claim 19, wherein a first portion of the ferroelectric film and a second portion of the channel layer are disposed between the capping layer and the substrate, wherein a sidewall of the capping layer contacting the dielectric layer is in a same plane with a first sidewall of the first portion of the ferroelectric film and a second sidewall of the second portion of the channel layer.

* * * * *